US011569305B2

(12) United States Patent
Bae et al.

(10) Patent No.: US 11,569,305 B2
(45) Date of Patent: Jan. 31, 2023

(54) DISPLAY PANEL INCLUDING REFLECTION PATTERN

(71) Applicant: Samsung Display Co., Ltd., Yongin-si (KR)

(72) Inventors: Kwang Soo Bae, Yongin-si (KR); Beomsoo Park, Hwaseong-si (KR); Eun-Ae Kwak, Gunpo-si (KR); Minjeong Oh, Gimpo-si (KR); Young Je Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 283 days.

(21) Appl. No.: 16/941,471

(22) Filed: Jul. 28, 2020

(65) Prior Publication Data

US 2021/0066399 A1 Mar. 4, 2021

(30) Foreign Application Priority Data

Aug. 27, 2019 (KR) ........................ 10-2019-0105083

(51) Int. Cl.
*H01L 27/32* (2006.01)
*H01L 51/52* (2006.01)

(52) U.S. Cl.
CPC ........ *H01L 27/322* (2013.01); *H01L 51/5275* (2013.01)

(58) Field of Classification Search
CPC combination set(s) only.
See application file for complete search history.

(56) References Cited

U.S. PATENT DOCUMENTS

| 10,312,306 | B2 | 6/2019 | Kim et al. | |
| 2017/0154930 | A1* | 6/2017 | Kim | H01L 27/322 |
| 2019/0057657 | A1 | 2/2019 | Liu et al. | |
| 2019/0348472 | A1 | 11/2019 | Yun et al. | |

FOREIGN PATENT DOCUMENTS

| JP | 5937124 | 6/2016 | |
| KR | 10-2016-0066635 | 6/2016 | |
| KR | 10-2017-0077929 | 7/2017 | |
| KR | 10-2018-0067766 | 6/2018 | |
| KR | 10-1945514 | 2/2019 | |
| WO | 2012043172 | 4/2012 | |
| WO | WO-2012043172 A1 * | 4/2012 | ........... G02B 6/0003 |

OTHER PUBLICATIONS

Examination Report dated Feb. 3, 2021, issue to European Patent Application No. 20191634.

* cited by examiner

*Primary Examiner* — Nduka E Ojeh
(74) *Attorney, Agent, or Firm* — H.C. Park & Associates, PLC

(57) ABSTRACT

A display panel including a light emitting element to emit a source light and including a first electrode, a light emitting layer disposed on the first electrode, and a second electrode disposed on the light emitting layer and outputting a source light, a pixel definition layer including an opening exposing at least a portion of the first electrode, an optical conversion pattern disposed on the pixel definition layer, a reflection pattern disposed on the light emitting element and including an inclined surface, and a first light blocking pattern disposed outside from the optical conversion pattern when viewed in a plan view.

25 Claims, 27 Drawing Sheets

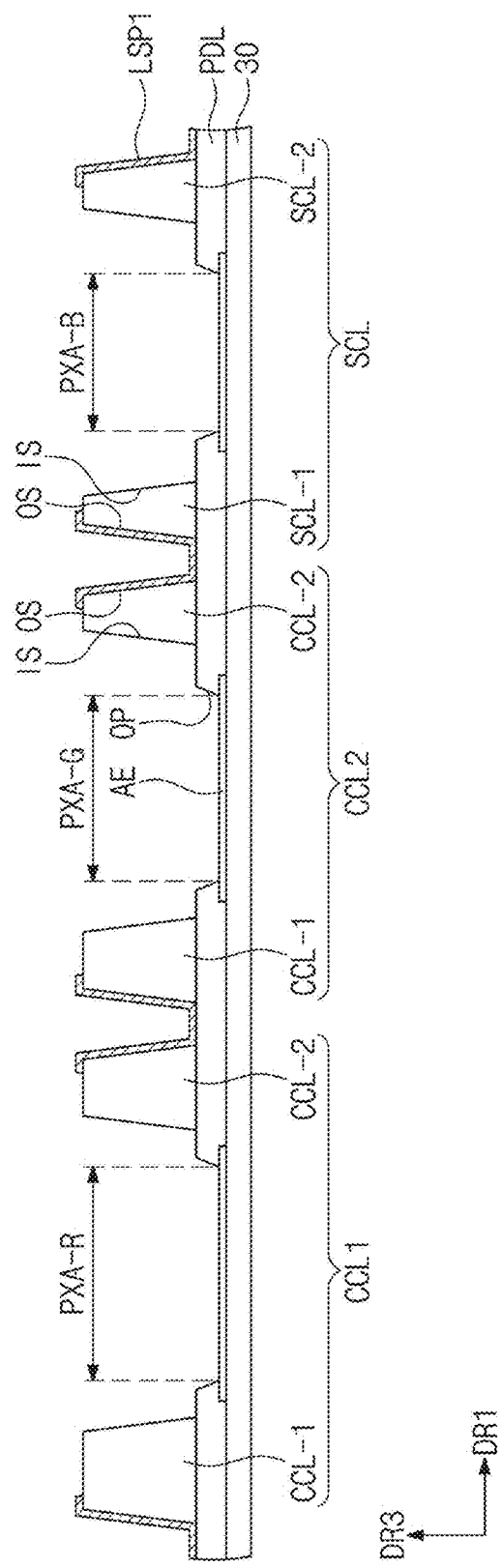
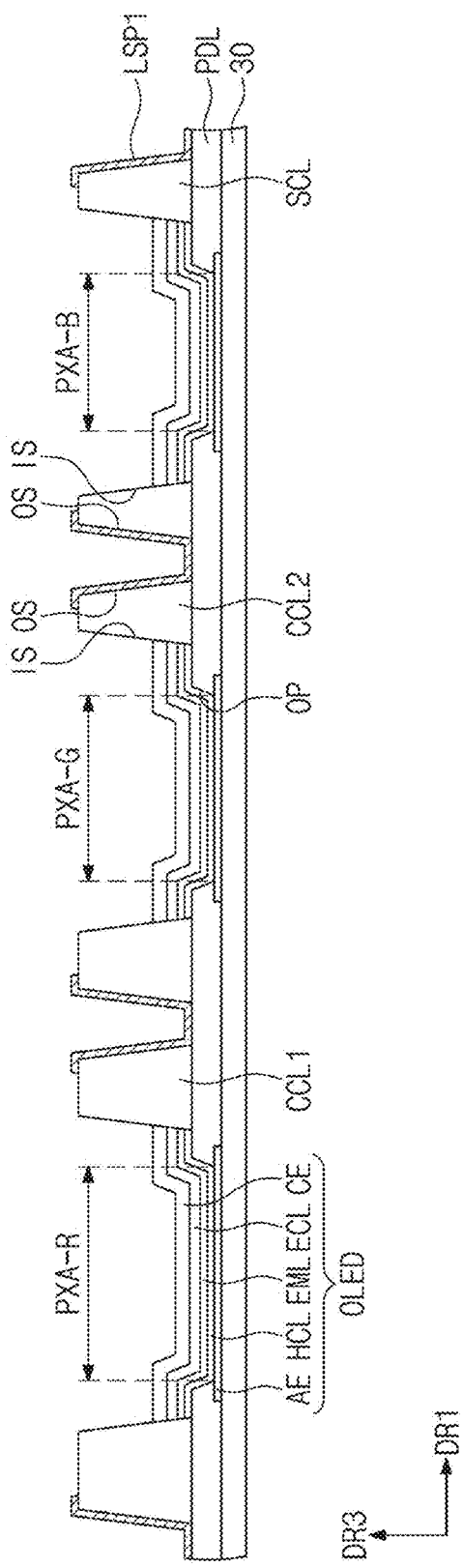

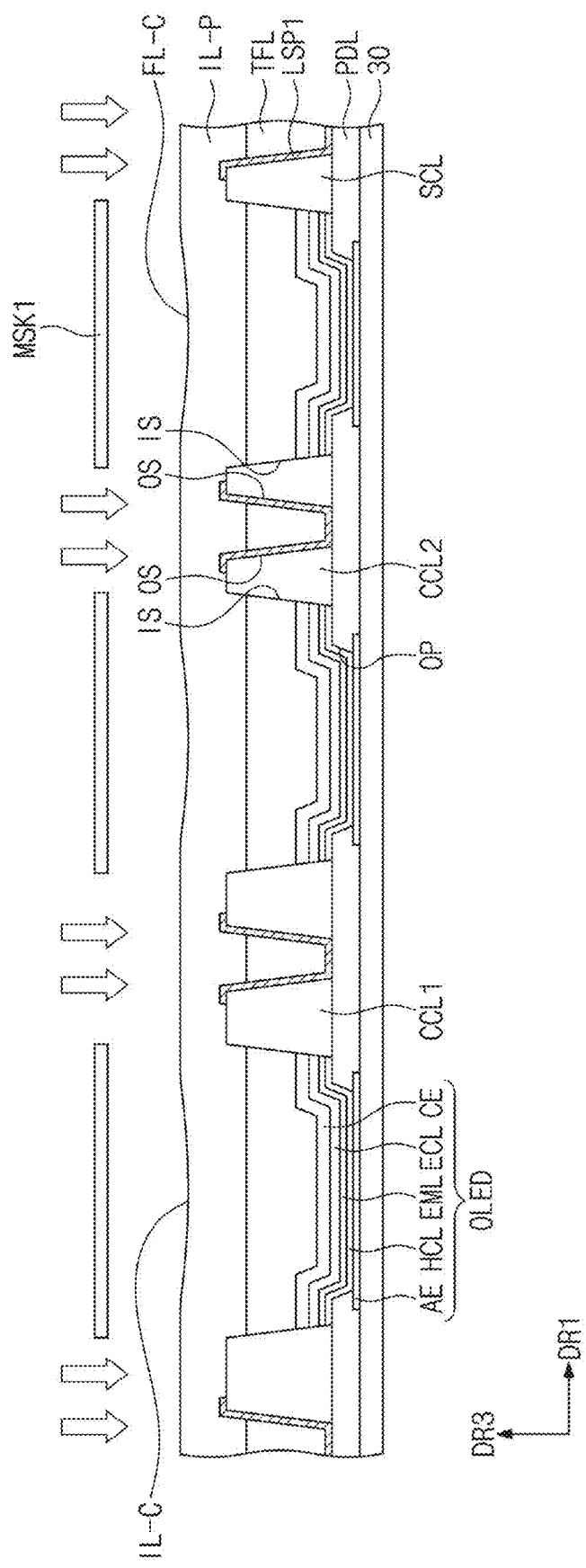

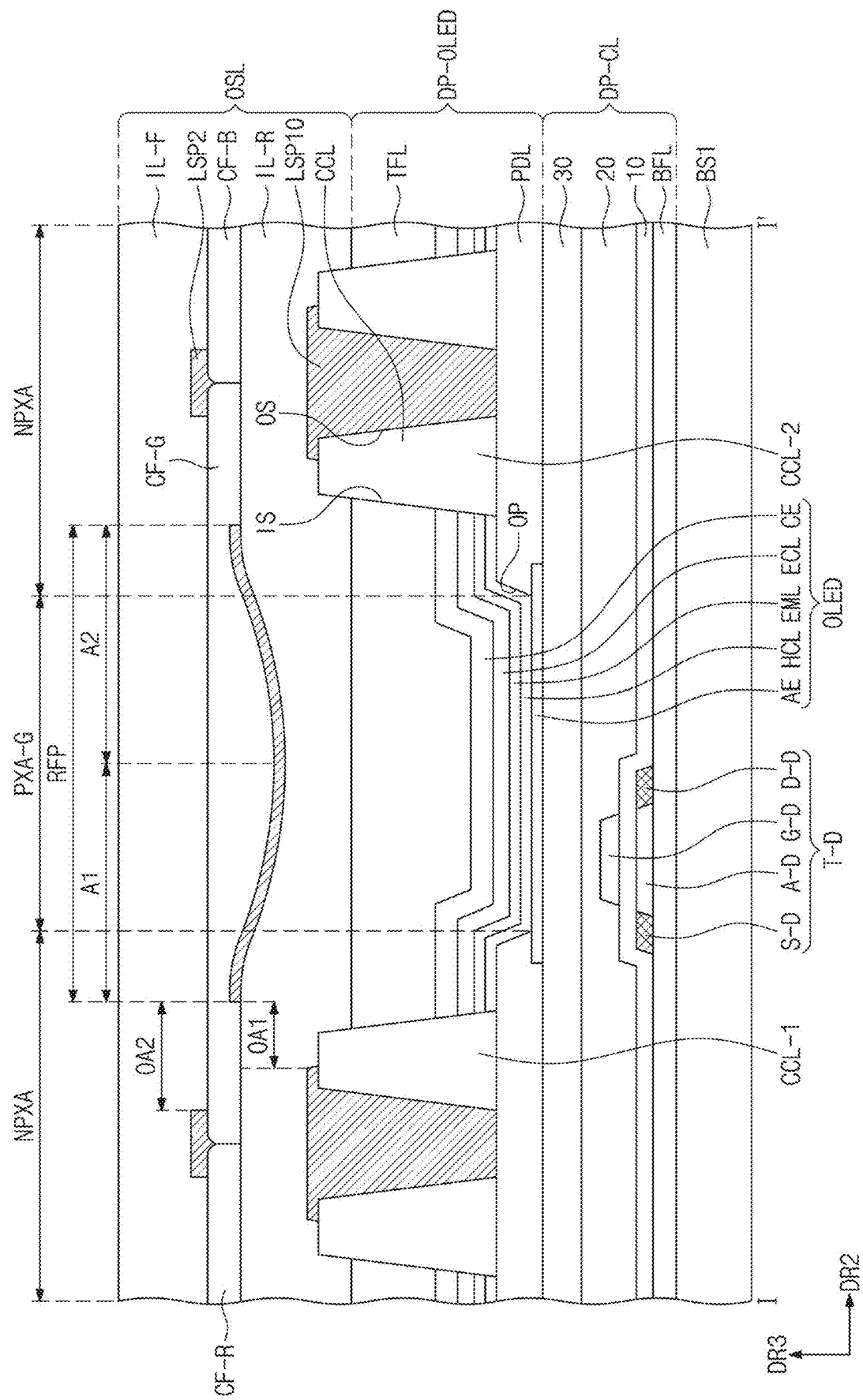

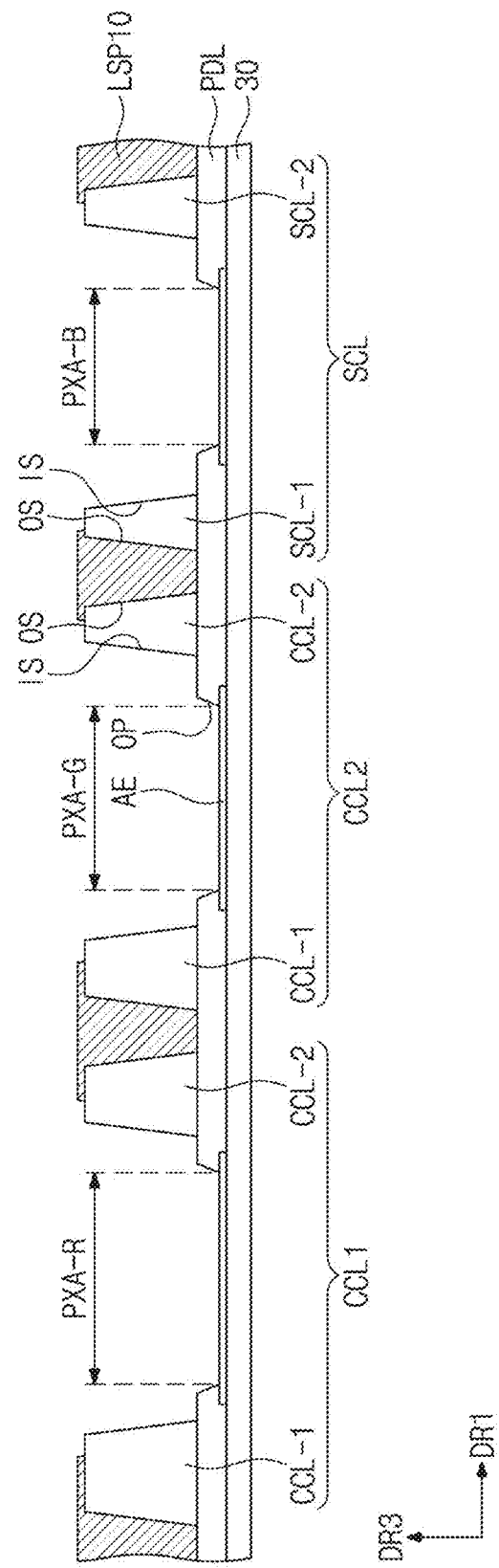

DISPLAY PANEL INCLUDING REFLECTION PATTERN

CROSS-REFERENCE TO RELATED APPLICATION

This application claims priority from and the benefit of Korean Patent Application No. 10-2019-0105083, filed on Aug. 27, 2019, which is hereby incorporated by reference for all purposes as if fully set forth herein.

BACKGROUND

Field

Embodiments of the invention relate generally to a display panel and, more specifically, to a display panel having a reflection structure.

Discussion of the Background

Display panels include a transmission-type display panel that selectively transmits a source light generated by a light source, and an emission-type display panel that generates a source light. In order to produce a color image, the display panel includes different kinds of color control layers according to pixels. The color control layer transmits a source light of a specific wavelength range or changes a color of a source light. In some cases, the color control layer does not change the color of the source light but changes optical characteristics of the source light.

The above information disclosed in this Background section is only for understanding of the background of the inventive concepts, and, therefore, it may contain information that does not constitute prior art.

SUMMARY

Display panels constructed according to embodiments of the invention are capable of improving optical efficiency.

Additional features of the inventive concepts will be set forth in the description which follows, and in part will be apparent from the description, or may be learned by practice of the inventive concepts.

A display panel according to an embodiment includes a light emitting element to emit a source light and including a first electrode, a light emitting layer disposed on the first electrode, and a second electrode disposed on the light emitting layer, a pixel definition layer including an opening exposing at least a portion of the first electrode, an optical conversion pattern disposed on the pixel definition layer, a reflection pattern disposed on the light emitting element and having an inclined surface, and a first light blocking pattern disposed outside the optical conversion pattern when viewed in a plan view.

The optical conversion pattern may be in contact with the pixel definition layer.

The light emitting element may further includes at least one of a hole control layer and an electron control layer overlapping with the light emitting layer, and a portion of at least one of the hole control layer and the electron control layer may be disposed between the pixel definition layer and the optical conversion pattern.

The display panel may further includes a color filter configured to transmit light converted from the source light by the optical conversion pattern.

The color filter may be disposed on the reflection pattern, and the color filter may overlap the reflection pattern and the optical conversion pattern, when viewed in a plan view.

The display panel may further include a first organic layer disposed on the optical conversion pattern and below the reflection pattern, in which at least a portion of the color filter may be disposed between the optical conversion pattern and the first organic layer.

The display panel may further include a second organic layer disposed on the reflection pattern and overlapping the first organic layer.

The reflection pattern and the first light blocking pattern may be spaced apart from each other, when viewed in a plan view.

The first light blocking pattern may include a metal layer in contact with an outer side surface of the optical conversion pattern.

The first light blocking pattern may include a black coloring agent in contact with an outer side surface of the optical conversion pattern.

The display panel may further include an organic layer disposed on the optical conversion pattern below the reflection pattern, and a second light blocking pattern disposed on the organic layer and overlapping with the first light blocking pattern when viewed in a plan view.

The display panel may further include at least one inorganic layer disposed between the organic layer and the light emitting element.

The optical conversion pattern may include a first pattern disposed at a side of the first electrode, and a second pattern disposed at an opposite side of the first electrode, when viewed in a plan view, and the inorganic layer may be disposed between the first pattern and the second pattern, when viewed in a plan view.

The reflection pattern may include a lens surface having at least one of a spherical shape, elliptical, lenticular shape, and polygonal pyramid shape, and the lens surface may include the inclined surface.

The optical conversion pattern may include a first pattern and a second pattern disposed at opposite sides of the first electrode when viewed in a plan view, the inclined surface may include a first region corresponding to the first pattern and a second region corresponding to the second pattern, and the first region and the second region may be provided as a single body.

A display panel according to another embodiment includes a first light emitting element and a second light emitting element configured to emit a source light, respectively, each light emitting element including a first electrode, a light emitting layer disposed on the first electrode, and a second electrode disposed on the light emitting layer, a pixel definition layer including a first opening and a second opening exposing at least a portion of the first electrode of a corresponding one of the first and second light emitting elements, a first optical conversion pattern disposed on the pixel definition layer and disposed outside the first electrode of the first light emitting element when viewed in a plan view, a second optical conversion pattern disposed on the pixel definition layer and disposed outside the first electrode of the second light emitting element when viewed in a plan view, a first reflection pattern and a second reflection pattern each including an inclined surface and disposed on the first light emitting element and second light emitting element, respectively, and an insulating layer overlapping the first optical conversion pattern, the second optical conversion pattern, the first reflection pattern, and the second reflection pattern, and disposed on the first optical conversion pattern and the second optical conversion pattern below the first reflection pattern and the second reflection pattern, a light blocking pattern disposed between the first optical conversion pattern and the second optical conversion pattern when viewed in a plan view.

The first electrode of the first light emitting element and the first electrode of the second light emitting element may be spaced apart from each other when viewed in a plan view, and the second electrode of the first light emitting element and the second electrode of the second light emitting element may be provided as a single body.

The light blocking pattern may include a metal layer disposed on an outer side surface of the first optical conversion pattern and an outer side surface of the second optical conversion pattern.

The first optical conversion pattern may include a first pattern and a second pattern disposed at opposite sides of the first electrode in a first direction when viewed in a plan view, and a third pattern and a fourth pattern disposed at opposite sides of the first electrode in a second direction perpendicular to the first direction when viewed in a plan view.

The inclined surface may include first, second, third, and fourth regions corresponding to the first, second, third, and fourth patterns, respectively.

The display panel may further include a first color filter to transmit a first light converted from the source light by the first optical conversion pattern, and a second color filter to transmit a second light converted from the source light by the second optical conversion pattern.

Each of a portion of the first color filter and a portion of the second color filter may be disposed between the first optical conversion pattern and the second optical conversion pattern.

The light blocking pattern may include a metal layer disposed on an outer side surface of the first optical conversion pattern and an outer side surface of the second optical conversion pattern, and the metal layer may be disposed between the outer side surface of the first optical conversion pattern and the portion of the first color filter.

A portion of the first color filter and a portion of the second color filter may be disposed on the light blocking pattern.

A display panel according to still another embodiment includes a light emitting element configured to emit a source light and including a first electrode, a light emitting layer disposed on the first electrode, and a second electrode disposed on the light emitting layer, a pixel definition layer including an opening exposing at least a portion of the first electrode, a first optical conversion pattern and a second optical conversion pattern disposed at two opposite sides of the first electrode on the pixel definition layer when viewed in a plan view, an upper insulating layer disposed on the second electrode, and a light blocking pattern disposed outside the first optical conversion pattern and the second optical conversion pattern when viewed in a plan view, in which the upper insulating layer is disposed between the first optical conversion pattern and the second optical conversion pattern when viewed in a plan view, and the upper insulating layer is in contact with the first optical conversion pattern and the second optical conversion pattern.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are included to provide a further understanding of the invention and are incorporated in and constitute a part of this specification, illustrate embodiments of the invention, and together with the description serve to explain the inventive concepts.

FIGS. 5A, 5B, 5C, 5D, 5E, 5F, 5G, 5H, 5I, 5J, and 5K are cross-sectional views illustrating a process of fabricating a display panel according to an embodiment.

FIG. 8A is a cross-sectional view illustrating a display panel according to an embodiment.

FIG. 8B is a cross-sectional view illustrating a process of fabricating a display panel according to an embodiment.

DETAILED DESCRIPTION

Figure 1A:
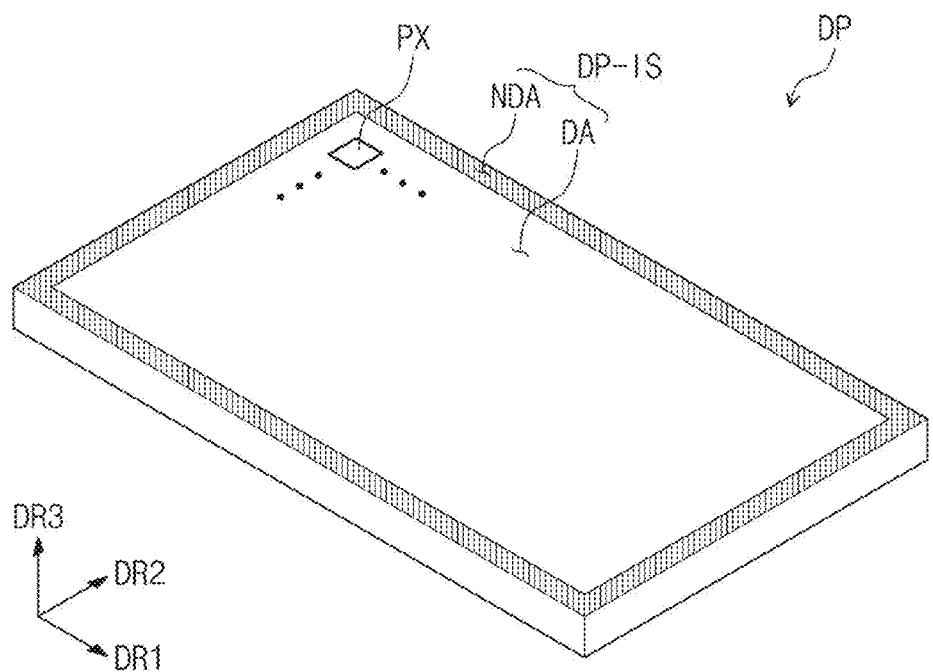
FIG. 1A is a perspective view illustrating a display panel according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
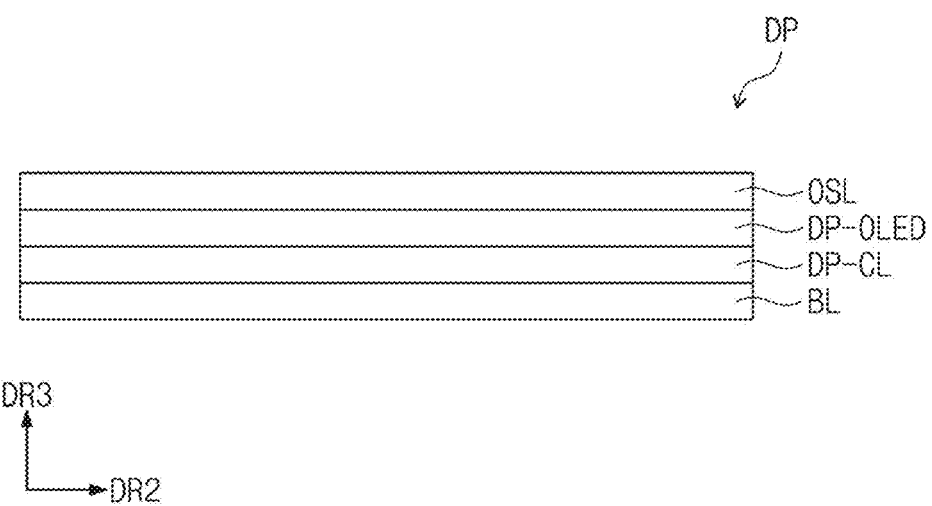
FIG. 1B is a cross-sectional view illustrating a display panel according to an embodiment.
Figure 1C:
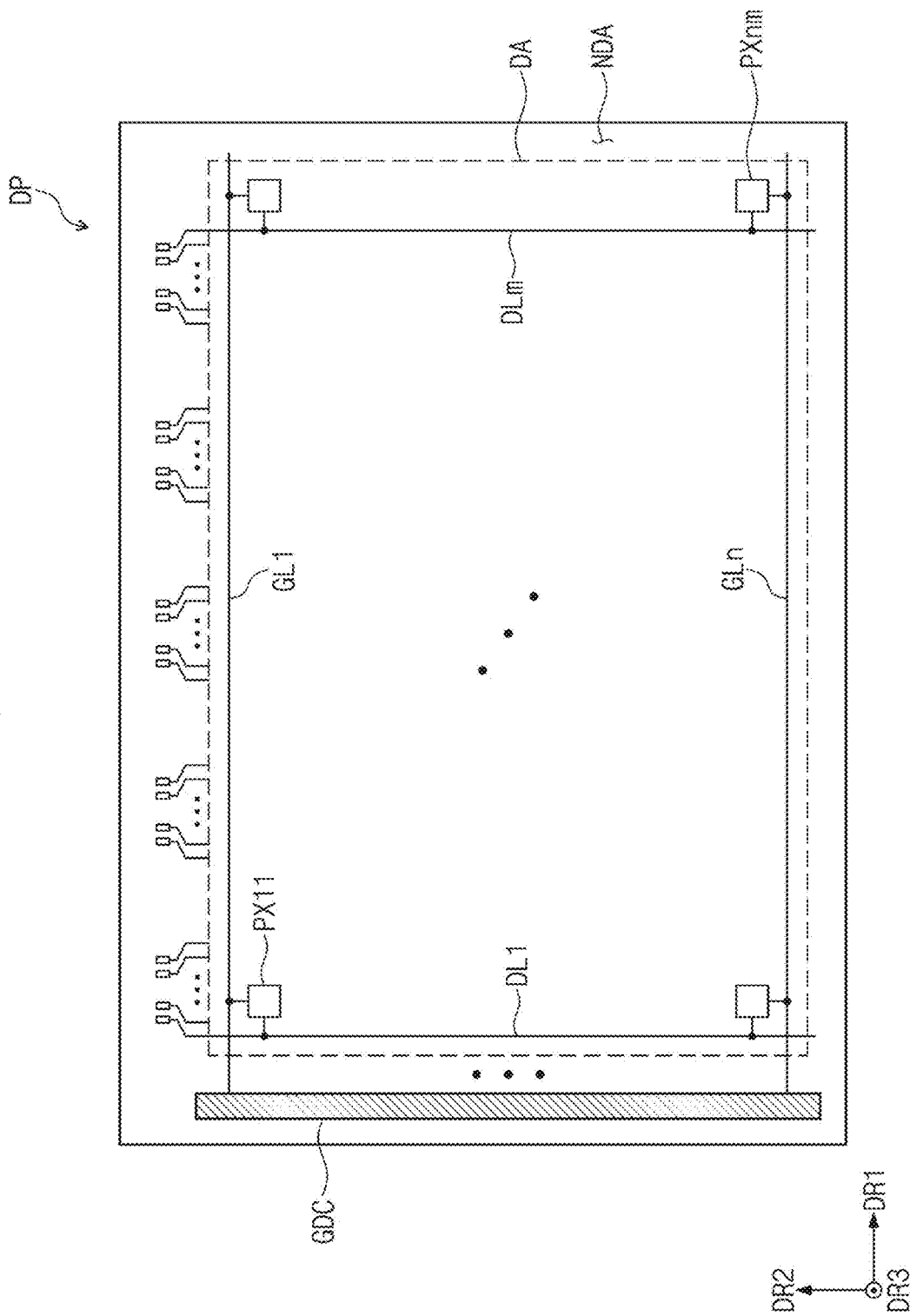
FIG. 1C is a plan view illustrating a display panel according to an embodiment.

FIG. 1A is a perspective view illustrating a display panel DP according to an exemplary embodiment. FIG. 1B is a cross-sectional view illustrating the display panel DP according to an exemplary embodiment. FIG. 1C is a plan view illustrating the display panel DP according to an exemplary embodiment.

As shown in FIG. 1A, the display panel DP may include a display surface DP-IS displaying an image. The display surface DP-IS may be parallel to a plane defined by a first direction axis DR1 and a second direction axis DR2. The display surface DP-IS may include a display region DA and a non-display region NDA. A pixel PX may be disposed in the display region DA but may not be disposed in the non-display region NDA. The non-display region NDA may be defined along an edge of the display surface DP-IS. The display region DA may be enclosed by the non-display region NDA. In some exemplary embodiments, the non-display region NDA may be omitted or may be disposed near only one side portion of the display region DA.

As used herein, a third direction axis DR3 may refer to a direction normal to the display surface DP-IS (i.e., a thickness direction of the display panel DP). The third direction DR3 may be used to differentiate a front or top surface of each element (e.g., a layer or a unit) from a back or bottom surface. However, the illustrated first to third direction axes DR1, DR2, and DR3 may be exemplary. Hereinafter, first to third directions may be directions indicated by the first to third direction axes DR1, DR2, and DR3, respectively, and will be identified with the same reference numbers.

The display panel DP according to the illustrated exemplary embodiment is shown as having a flat-type display surface DP-IS, but the inventive concepts are not limited thereto. In some exemplary embodiments, the display panel DP may have a curved display surface or a three-dimensional display surface. The three-dimensional display surface may include a plurality of display regions, which are oriented in different directions.

As shown in FIG. 1B, the display panel DP may include a base layer BL, a circuit device layer DP-CL, a display device layer DP-OLED, and an optical structure layer OSL. The base layer BL may include a synthetic resin substrate or a glass substrate. The circuit device layer DP-CL may include at least one insulating layer and at least one circuit device. The circuit device may include signal lines, pixel-driving circuits, and so forth. The circuit device layer DP-CL may be formed by forming an insulating layer, a semiconductor layer, and a conductive layer using a coating or deposition process, and patterning the insulating layer, the semiconductor layer, and the conductive layer using a photolithography and/or etching process. The display device layer DP-OLED may include at least one display element. The optical structure layer OSL may convert a color of light provided from one display element. The optical structure layer OSL may include an optical conversion pattern and a structure for increasing the conversion efficiency of light.

FIG. 1C illustrates the arrangement of signal lines GL1-GLn and DL1-DLm and pixels PX11-PXnm viewed in a plan view. The signal lines GL1-GLn and DL1-DLm may include a plurality of gate lines GL1-GLn and a plurality of data lines DL1-DLm.

Each of the pixels PX11-PXnm may be connected to a corresponding one of the gate lines GL1-GLn and a corresponding one of the data lines DL1-DLm. Each of the pixels PX11-PXnm may include a pixel driving circuit and a display element. According to the structure of the pixel driving circuit of the pixels PX11-PXnm, signal lines of other types may be further provided in the display panel DP.

In FIG. 1C, the pixels PX11-PXnm are shows to be arranged in a matrix shape, however, the inventive concepts are not limited thereto. In some exemplary embodiments, the pixels PX11-PXnm may be arranged in a pentile matrix shape. For example, the pixels PX11-PXnm may be disposed at vertices of a diamond structure. A gate driving circuit GDC may be integrated on the display panel DP through an oxide silicon gate (OSG) driver circuit process or an amorphous silicon gate (ASG) driver circuit process.

Figure 2A:
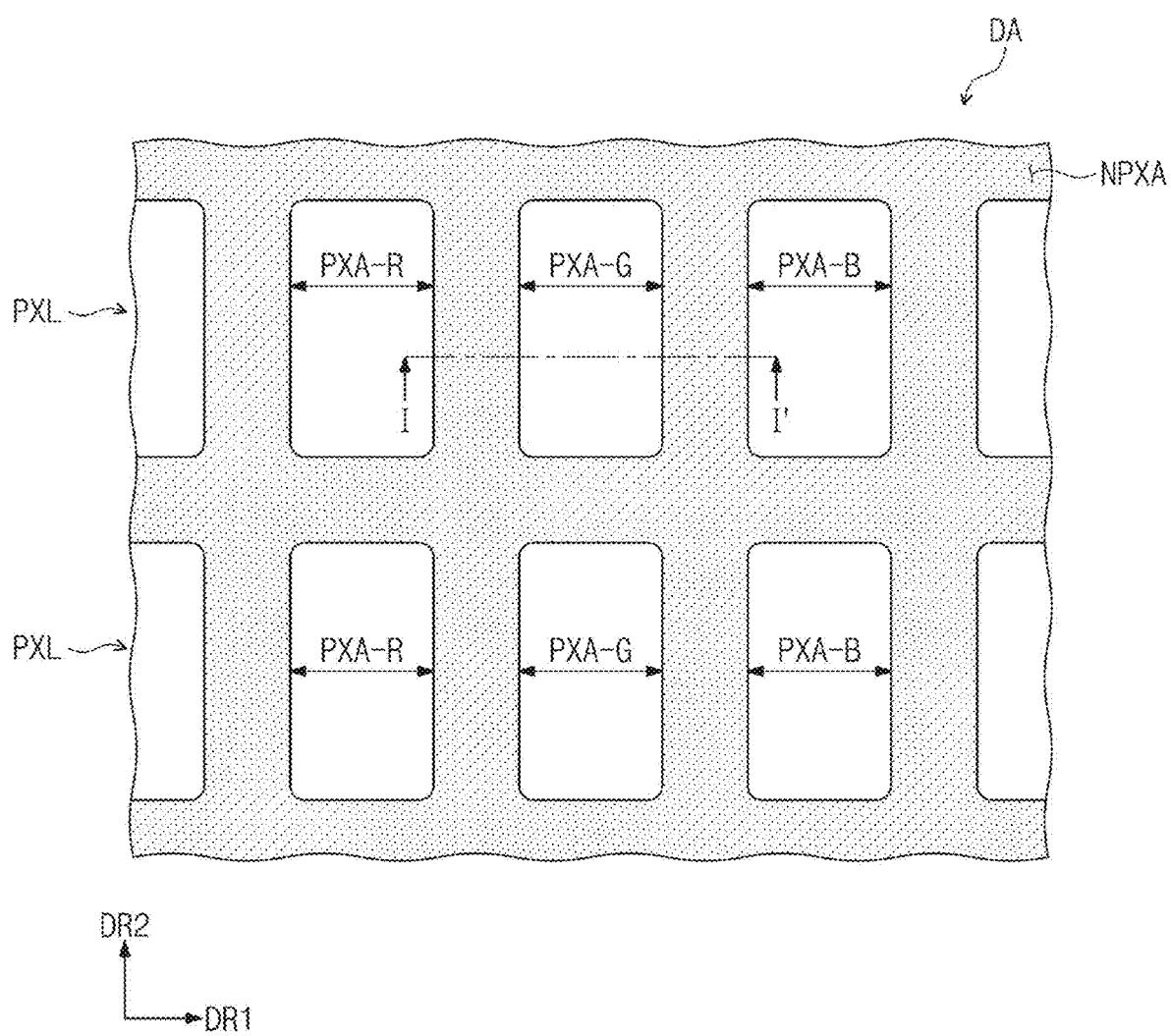
FIG. 2A is an enlarged plan view illustrating a display panel according to an embodiment.
Figure 2B:
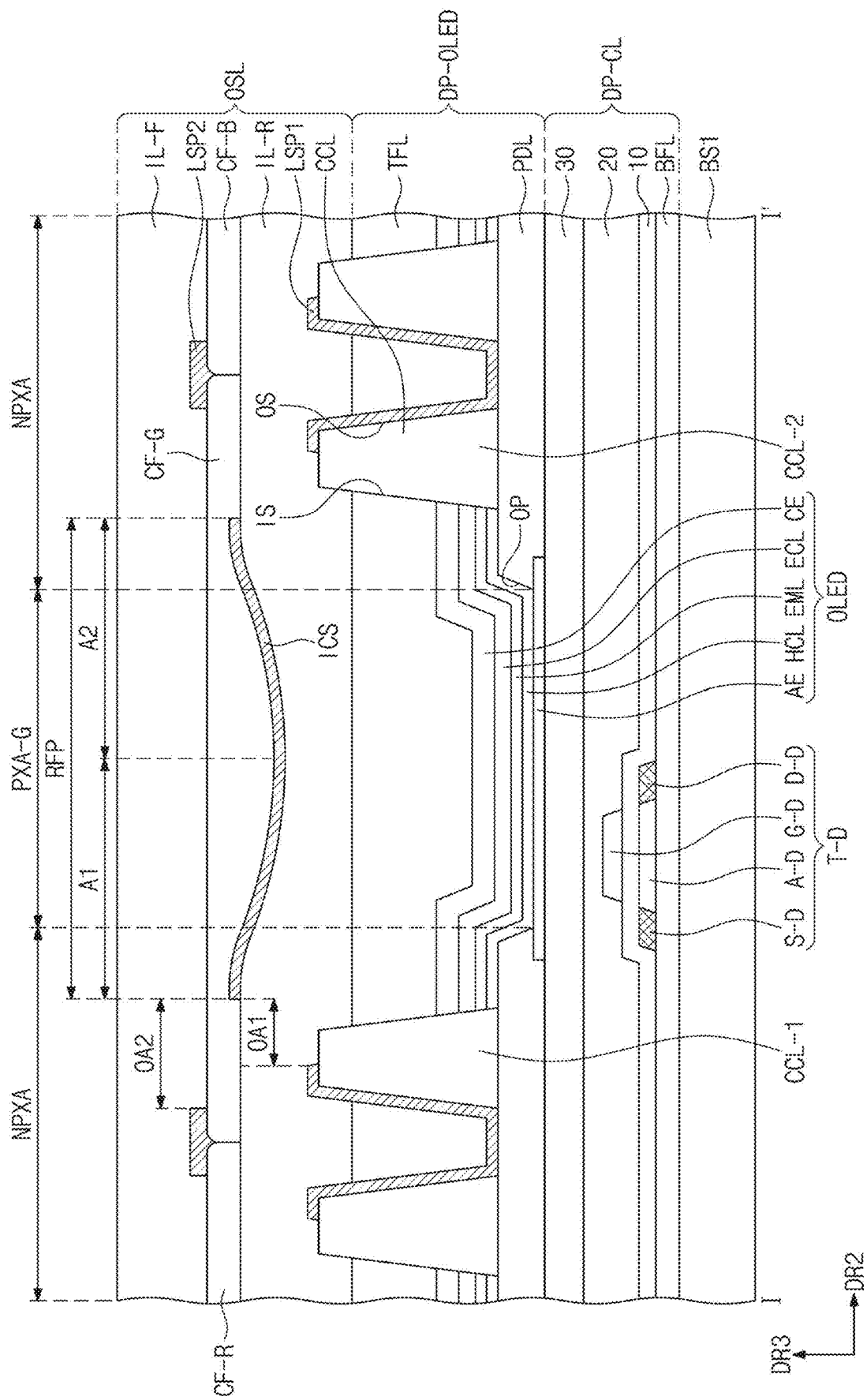
FIG. 2B is a cross-sectional view illustrating a display panel according to an embodiment.

FIG. 2A is an enlarged plan view illustrating the display panel DP according to an exemplary embodiment. FIG. 2B is a cross-sectional view illustrating the display panel DP according to an exemplary embodiment.

FIG. 2A exemplarily illustrates six pixel regions PXA-R, PXA-G, and PXA-B arranged along two pixel rows PXL. FIG. 2B illustrates a cross-section along line I-I' of FIG. 2A. In the illustrated exemplary embodiment, three kinds of the pixel regions PXA-R, PXA-G, and PXA-B shown in FIG. 2A may be repeatedly disposed throughout the display region DA (e.g., see FIG. 1A). A peripheral region NPXA may be disposed around the first to third pixel regions PXA-R, PXA-G, and PXA-B. The peripheral region NPXA may delimit the first to third pixel regions PXA-R, PXA-G, and PXA-B, and a structure of preventing a color-mixing issue between the first to third pixel regions PXA-R, PXA-G, and PXA-B may be disposed in the peripheral region NPXA.

In the illustrated exemplary embodiment, the first to third pixel regions PXA-R, PXA-G, and PXA-B are shown as having the same planar area, but the inventive concepts are not limited thereto. In some exemplary embodiments, at least two regions of the first to third pixel regions PXA-R, PXA-G, and PXA-B may have different areas from each other. When viewed in a plan view, the first to third pixel regions PXA-R, PXA-G, and PXA-B are illustrated to have corner regions having a rounded rectangular shape, but the inventive concepts are not limited thereto. In some exemplary embodiments, when viewed in a plan view, the first to third pixel regions PXA-R, PXA-G, and PXA-B may have other polygonal shapes, such as a diamond or pentagonal shape.

One of the first to third pixel regions PXA-R, PXA-G, and PXA-B may provide a third color light corresponding to the source light, another one may provide a first color light different from the third color light, and the other one may provide a second color light different from the third and first color lights. In the illustrated exemplary embodiment, the third pixel region PXA-B may provide the third color light. In the illustrated exemplary embodiment, the first pixel region PXA-R may provide a red light, the second pixel region PXA-G may provide a green light, and the third pixel region PXA-B may provide a blue light.

Referring to FIG. 2B, the circuit device layer DP-CL may include a transistor T-D functioning as a circuit device. The structure of the circuit device layer DP-CL may vary depending on the design of the pixel driving circuit, and one transistor T-D is exemplarily illustrated in FIG. 2B. FIG. 2B exemplarily shows the disposition of an active A-D, a source S-D, a drain D-D, a gate G-D forming the transistor T-D according to an exemplary embodiment. However, the disposition of the active A-D, the source S-D, and the drain D-D may be varied according to a doping concentration or conductive of a semiconductor pattern.

The circuit device layer DP-CL may include a buffer layer BFL, a first insulating layer 10, a second insulating layer 20, and a third insulating layer 30. For example, the buffer layer BFL, the first insulating layer 10, and the second insulating layer 20 may be inorganic layers, and the third insulating layer 30 may be an organic layer.

The display device layer DP-OLED may include a light emitting element OLED. The light emitting element OLED may generate the afore-described source light. The light emitting element OLED may include a first electrode AE, a second electrode CE, and a light emitting layer EML disposed therebetween. In the illustrated exemplary embodiment, the display device layer DP-OLED may include an organic light emitting diode functioning as a light emitting element. The display device layer DP-OLED may include a pixel definition layer PDL. For example, the pixel definition layer PDL may be an organic layer.

The first electrode AE may be disposed on the third insulating layer 30. The first electrode AE may be directly or indirectly connected to the transistor T-D. An opening OP may be defined in the pixel definition layer PDL. The opening OP of the pixel definition layer PDL may expose at least a portion of the first electrode AE. The opening OP may define the pixel region PXA-G.

A hole control layer HCL, the light emitting layer EML, an electron control layer ECL may be overlapped with at least the pixel region PXA-G. The hole control layer HCL, the light emitting layer EML, the electron control layer ECL, and the second electrode CE may be disposed in common in the first to third pixel regions PXA-R, PXA-G, and PXA-B (e.g., see FIG. 2A). In particular, each of the hole control layer HCL, the light emitting layer EML, the electron control layer ECL, and the second electrode CE, which are overlapped with the first to third pixel regions PXA-R, PXA-G, and PXA-B, may be provided as a single body. In some exemplary embodiments, at least one of the hole control layer HCL, the light emitting layer EML, and the electron control layer ECL may include a plurality of patterns, which are disposed in the first to third pixel regions PXA-R, PXA-G, and PXA-B, respectively.

The hole control layer HCL may include a hole transport layer and. In an exemplary embodiment, the hole control layer HCL may further include a hole injection layer. The light emitting layer EML may generate a blue light. The blue light may have a wavelength ranging from 410 nm to 480 nm. A light-emitting spectrum of the blue light may have a high peak within a wavelength range of 440 nm to 460 nm. The electron control layer ECL may include an electron transport layer. In an exemplary embodiment, the electron control layer ECL may further include an electron injection layer.

The display device layer DP-OLED may include an upper insulating layer TFL protecting the second electrode CE. The upper insulating layer TFL may include at least one of organic or inorganic materials. The upper insulating layer TFL may have a multi-layered structure, in which an inorganic layer and an organic layer are repeatedly provided. In an exemplary embodiment, the upper insulating layer TFL may include a sealing structure including an inorganic layer, an organic layer, and an inorganic layer. The upper insulating layer TFL may further include a refractive index control layer for improving light-emitting efficiency.

The optical structure layer OSL may include an optical conversion pattern CCL, a reflection pattern RFP, and a first light blocking pattern LSP1. The optical conversion pattern CCL may be disposed on the pixel definition layer PDL. According to the illustrated exemplary embodiment, the optical conversion pattern CCL is in contact with the pixel definition layer PDL, but the inventive concepts are not limited thereto. In some exemplary embodiments, at least one other layer may be further disposed between the pixel definition layer PDL and the optical conversion pattern CCL.

The optical conversion pattern CCL may include a first pattern CCL-1 and a second pattern CCL-2, which are respectively disposed at opposite sides of the first electrode AE. The optical conversion pattern CCL may absorb a source light, which is generated by the light emitting element OLED, and then may generate light having a color different from the source light. The optical conversion pattern CCL may include a base resin and quantum dots, which are mixed or dispersed in the base resin. The base resin may be a medium material, in which the quantum dots are dispersed, and may be made of at least one of various resin composites, which are called "binder" generally. However, the inventive concepts are not limited thereto. As used herein, when the quantum dots can be dispersed in a medium material, the medium material may be referred to as a base resin, regardless of its name, additional function, or constituents. The base resin may be a polymer resin. For example, the base resin may be acrylic resins, urethane resins, silicone resins, and/or epoxy resins. The base resin may be transparent.

Quantum dots may be particles causing a change in wavelength of an incident light. Each of the quantum dots may have a nanometer-order crystalline material consisting of hundreds to thousands of atoms, and may exhibit an increase in band gap, due to its small size and the consequent quantum confinement effect. When an energy of light incident to the quantum dots is greater than a band gap of the quantum dots, each of the quantum dots may absorb light and transition into an excited state, and then, may emit light of a specific wavelength when returning to its ground state. The wavelength of the emitted light may be determined by the band gap. As such, it may be possible to control the quantum confinement effect and the light-emitting characteristics of the optical conversion pattern CCL by adjusting sizes or compositions of the quantum dots.

The quantum dot may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The compounds may be selected from the group consisting of ternary compounds (e.g., including $AgInS_2$, $CuInS_2$, $AgGaS_2$, and $CuGaS_2$), mixtures of the ternary compounds, quaternary compounds (e.g., including $AgInGaS_2$ and $CuInGaS_2$), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InAlP, InNP, InNAs, InNSb, InPAs, and InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds. In an exemplary embodiment, the III-V compounds may further include one of the group II metals. For example, InZnP or the like may be selected as a III-II-V compound.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

The binary, ternary, or quaternary compound may have a uniform concentration throughout the particle, or may have a spatially varying concentration distribution in each particle.

The quantum dots may have a core-shell structure including a core and a shell enclosing the core. In an exemplary embodiment, the quantum dots may have a core/shell structure, in which one quantum dot is enclosed by another quantum dot. At an interface between the core and the shell, an element contained in the shell may have a concentration gradient decreasing in a central direction.

Each of the quantum dots may be a nanometer-scale particle. Each of the quantum dots may have a light-emitting wavelength spectrum whose full width half maximum (FWHM) is less than about 45 nm (in particular, less than about 40 nm or in more particular, less than about 30 nm), and in this case, it may be possible to improve color purity or color reproduction characteristics. Furthermore, the quantum dots may allow light to be emitted radially, and thus, it may be possible to improve a viewing angle property.

In an exemplary embodiment, the quantum dots may be a spherical, pyramid-shaped, multi-arm, or cubic nano particle. In another exemplary embodiment, the quantum dots may be a nano tube, a nano wire, a nano fiber, a nano plate-shaped particle, but the inventive concepts are not limited thereto. A wavelength or a color of light emitted from the quantum dot may be determined by a particle size of the quantum dot, and thus, when the quantum dots are provided in various sizes, lights converted by the quantum dots may have various colors (e.g., red, green, and blue).

The upper insulating layer TFL may be disposed between the first and second patterns CCL-1 and CCL-2. The upper insulating layer TFL may be in contact with inner side surfaces IS of the first and second patterns CCL-1 and CCL-2.

The first light blocking pattern LSP1 may be disposed outside the first and second patterns CCL-1 and CCL-2. The first light blocking pattern LSP1 may prevent a portion of the source light, which is not converted by the optical conversion pattern CCL, from being leaked to the pixel region PXA-R or PXA-B adjacent thereto.

The first light blocking pattern LSP1 may be in contact with outer side surfaces OS of the first and second patterns CCL-1 and CCL-2. The optical conversion pattern CCL for the pixel region PXA-R or PXA-B, which is adjacent to the optical conversion pattern CCL for a corresponding pixel region PXA-G, may be disposed in the peripheral region NPXA. The first light blocking pattern LSP1 may be in contact with each of the outer side surfaces OS of two optical conversion patterns CCL.

The first light blocking pattern LSP1 may include a metal layer. The metal layer may include a metallic material having high reflectance. For example, the metal layer may include a metallic material (e.g., aluminum). The source light reflected by the metal layer may be provided to the quantum dots to improve optical efficiency.

The first light blocking pattern LSP1 may include a black coloring agent. The black coloring agent may include a black dye or a black pigment. The black coloring agent may include metallic materials, such as carbon black, chromium, or oxides thereof.

The reflection pattern RFP may be disposed on the light emitting element OLED. The reflection pattern RFP may be overlapped with the pixel region PXA-G. The reflection pattern RFP may include a metallic material having high reflectance. The reflection pattern RFP may include an inclined surface ICS. The reflection pattern RFP may include a first region A1, which provides the source light to the first pattern CCL-1, and a second region A2, which provides the source light to the second pattern CCL-2. The first and second regions A1 and A2 of the reflection pattern RFP are exemplarily illustrated as forming a single body, but the inventive concepts are not limited thereto. For example, in some exemplary embodiments, the reflection pattern RFP may include two portions, which are spaced apart from each other and correspond to the first and second regions A1 and A2.

The reflection pattern RFP may be disposed on an insulating layer IL-R covering the upper insulating layer TFL and the optical conversion pattern CCL. The insulating layer IL-R may be an organic layer (hereinafter, a first organic layer). In the illustrated exemplary embodiment, the first organic layer IL-R is illustrated as an element different from the upper insulating layer TFL, but in some exemplary embodiments, the first organic layer IL-R may be defined as a part of the upper insulating layer TFL.

When viewed in a plan view, the reflection pattern RFP may not overlap with the first light blocking pattern LSP1. When viewed in a plan view, a region between an edge of the reflection pattern RFP and an edge of the first light blocking pattern LSP1 may be defined as a first light-emitting region OA1.

A color filter CF-G may be disposed on the insulating layer IL-R. The color filter CF-G may transmit the converted light. The color filter CF-G may include a base resin and a dye and/or pigment dispersed in the base resin. The base resin may be a medium material, in which the dye and/or pigment is dispersed, and may be made of at least one of various resin composites, which are called "binder" generally.

When viewed in a plan view, the color filter CF-G may be overlapped with the reflection pattern RFP and the optical conversion pattern CCL. When viewed in a plan view, the color filter CF-G may be overlapped with the first light-emitting region OA1.

A second light blocking pattern LSP2 may be disposed on the color filter CF-G. The second light blocking pattern LSP2 may include a black coloring agent. The second light blocking pattern LSP2 may prevent a mixing issue from occurring between adjacent ones of the pixel regions PXA-R, PXA-G, and PXA-B. The second light blocking pattern LSP2 may be overlapped with edges of adjacent ones of the color filters CF-R, CF-G, and CF-B.

When viewed in a plan view, the second light blocking pattern LSP2 may be overlapped with the first light blocking pattern LSP1. A region between the edge of the reflection pattern RFP and the edge of the second light blocking pattern LSP2 may be defined as a second light-emitting region OA2. An insulating layer IL-F may be disposed on the color filter CF-G to cover the second light blocking pattern LSP2. The insulating layer IL-F may be an organic layer (hereinafter, a second organic layer). The second organic layer IL-F may provide a flat top surface.

Figure 3A:
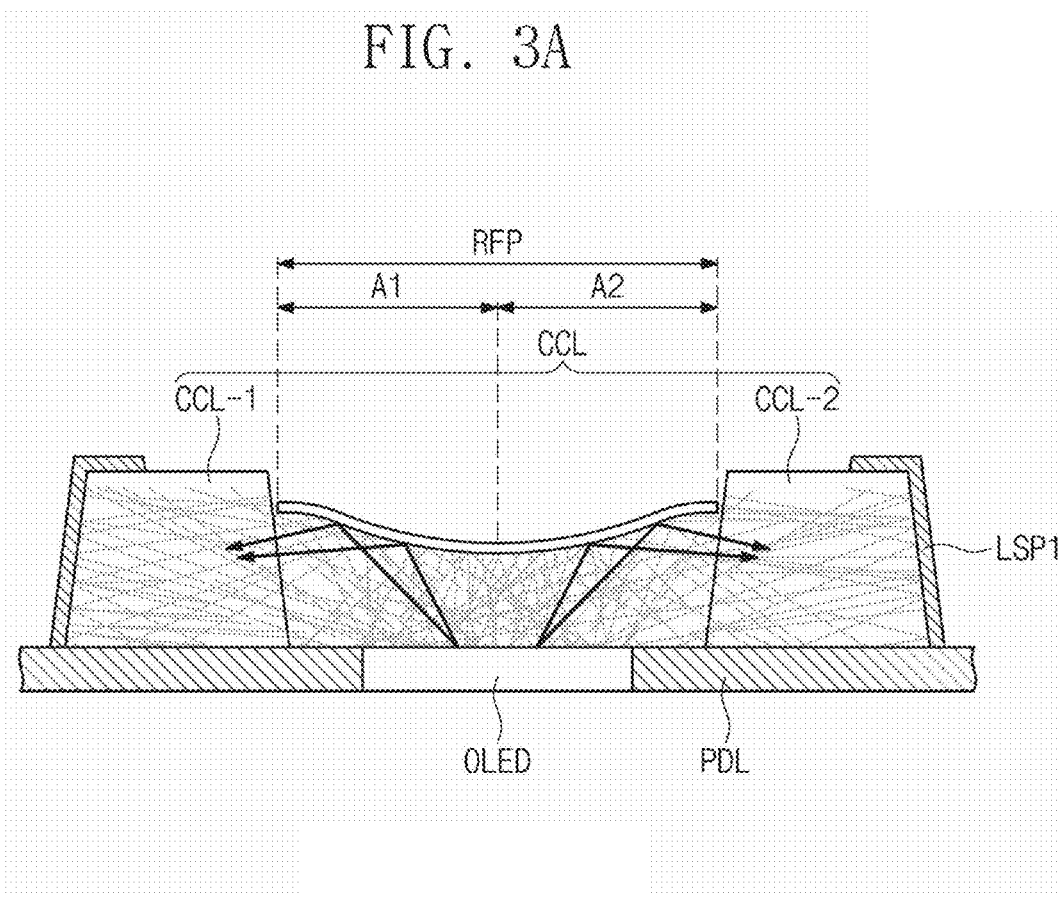
FIG. 3A is a cross-sectional view illustrating propagation paths of a source light according to an embodiment.
Figure 3B:
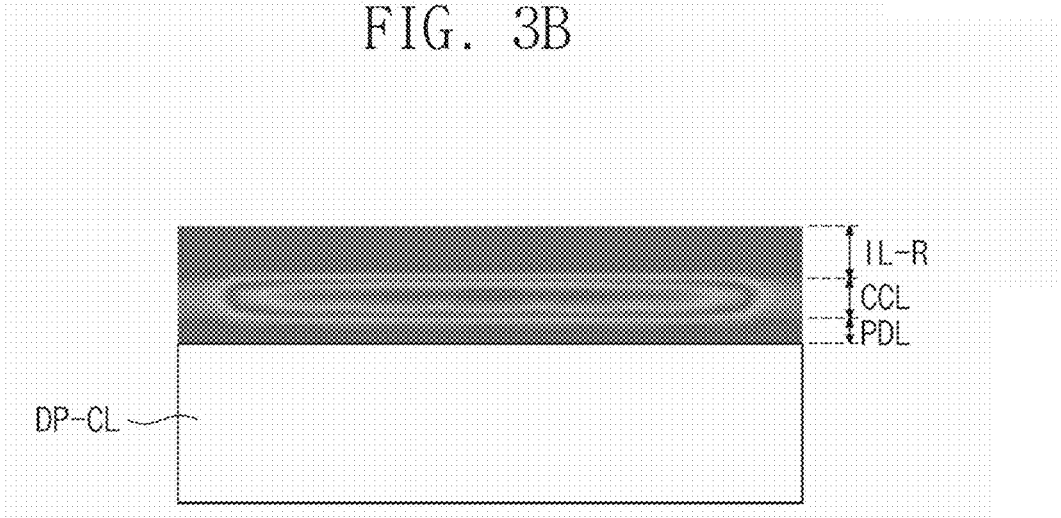
FIG. 3B is a diagram illustrating brightness of a source light, which is incident into a stacking structure of a display panel according to an embodiment.

FIG. 3A is a cross-sectional view illustrating propagation paths of a source light according to an exemplary embodiment. FIG. 3B is a diagram illustrating brightness of a source light, which is incident into a stacking structure of the display panel DP according to an exemplary embodiment. FIGS. 3C to 3F are perspective views illustrating the reflection pattern RFP according to exemplary embodiments.

As shown in FIG. 3A, a source light generated by the light emitting element OLED may be incident into the reflection pattern RFP. The source light reflected by the first region A1 may be incident into the first pattern CCL-1, and the source light reflected by the second region A2 may be incident into the second pattern CCL-2.

Referring to FIG. 3B, light reflected by the reflection pattern RFP may be concentrically provided to the optical conversion pattern CCL. Unlike the structure illustrated in FIG. 2B, FIG. 3B illustrates a vertical section defined by the second direction DR2 and the third direction DR3. The cross-section of FIG. 3B is a cross-section of the optical conversion pattern CCL. Most of the light reflected by the reflection pattern RFP may be incident into the optical conversion pattern CCL, and thus, the optical conversion pattern CCL may generate a sufficient amount of a conversion light. It may be possible to reduce an amount of light lost when the source light is incident into the optical conversion pattern CCL.

Figure 3C:
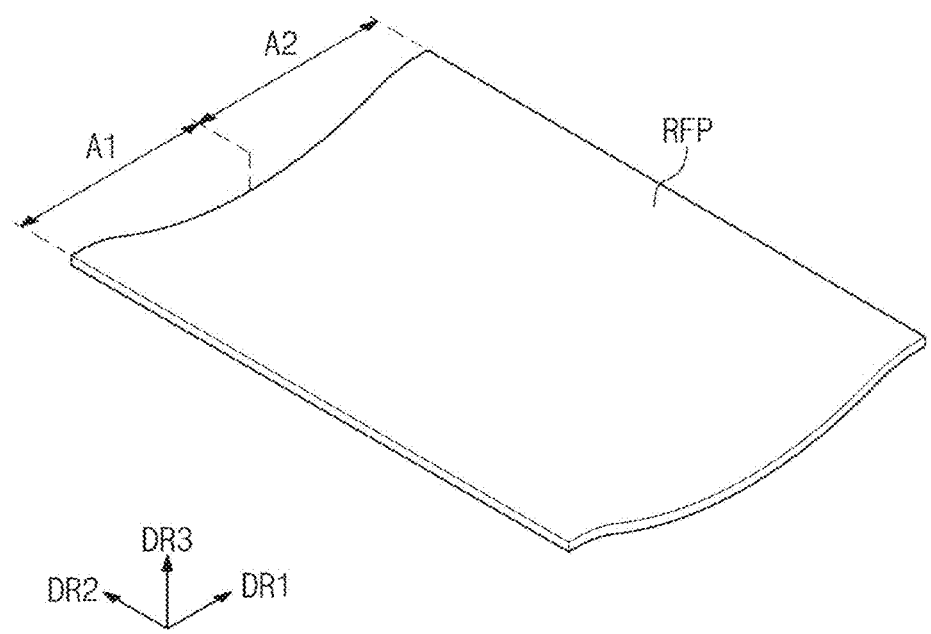
FIGS. 3C, 3D, 3E, and 3F are perspective views illustrating reflection patterns according to embodiments.
Figure 3D:
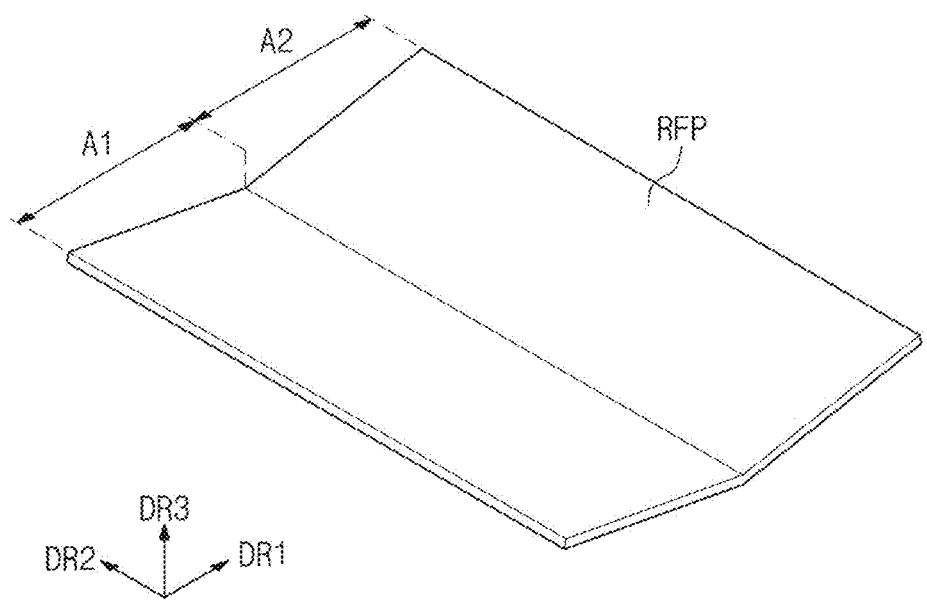
Figure 3E:
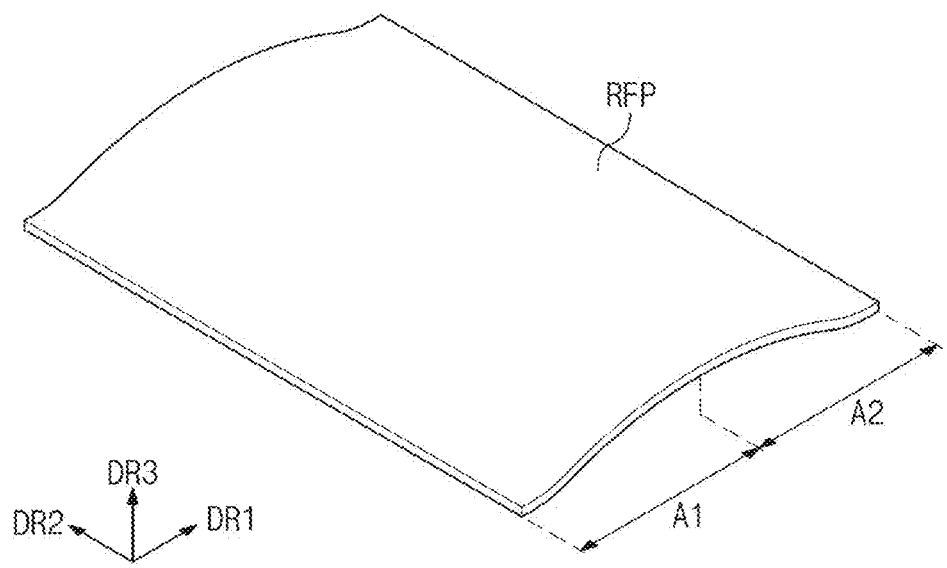
Figure 3F:
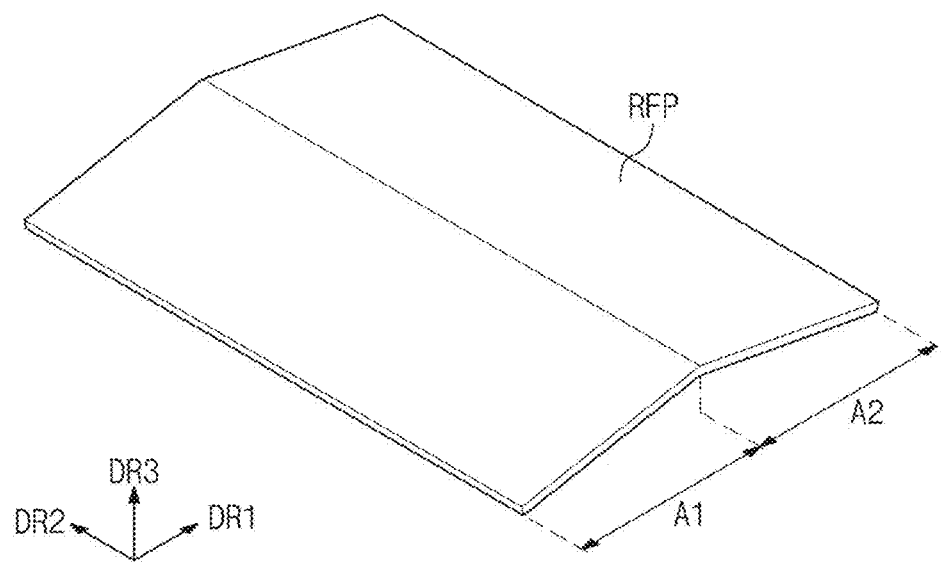

As shown in FIG. 3C, the reflection pattern RFP may include a lenticular lens surface. As shown in FIG. 3D, the reflection pattern RFP may include two inclined surfaces. As shown in FIGS. 3E and 3F, the reflection pattern RFP may have a vertically inverted shape of the reflection pattern RFP shown in FIGS. 3C and 3D. In this case, the source light incident into the first region A1 (e.g., see FIG. 3A) may be reflected to the second region A2 (e.g., see FIG. 3A), and the source light incident into the second region A2 may be reflected to the first pattern CCL-1.

Figure 4A:
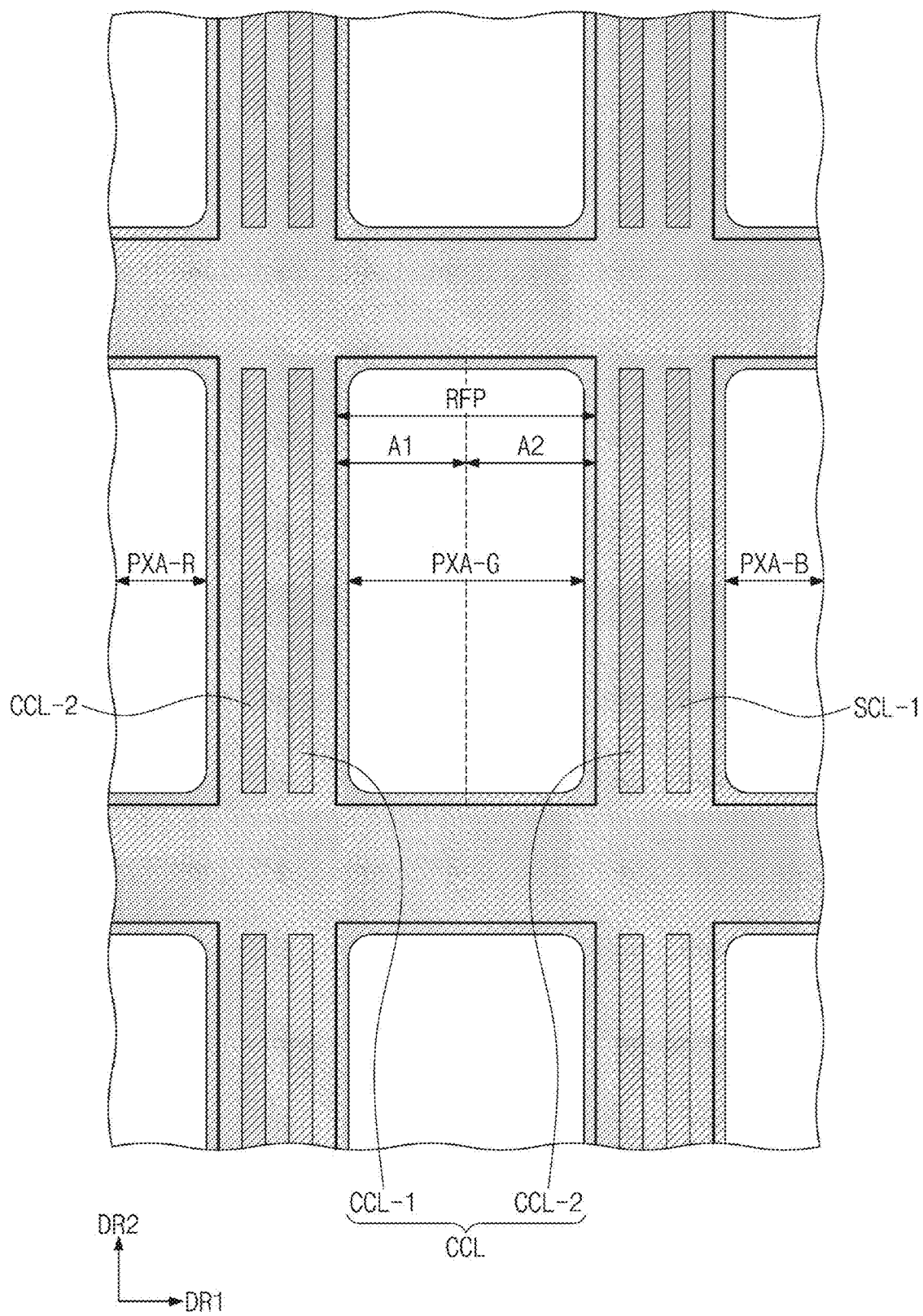
FIGS. 4A and 4B are enlarged plan views illustrating a display panel according to an embodiment.
Figure 4B:
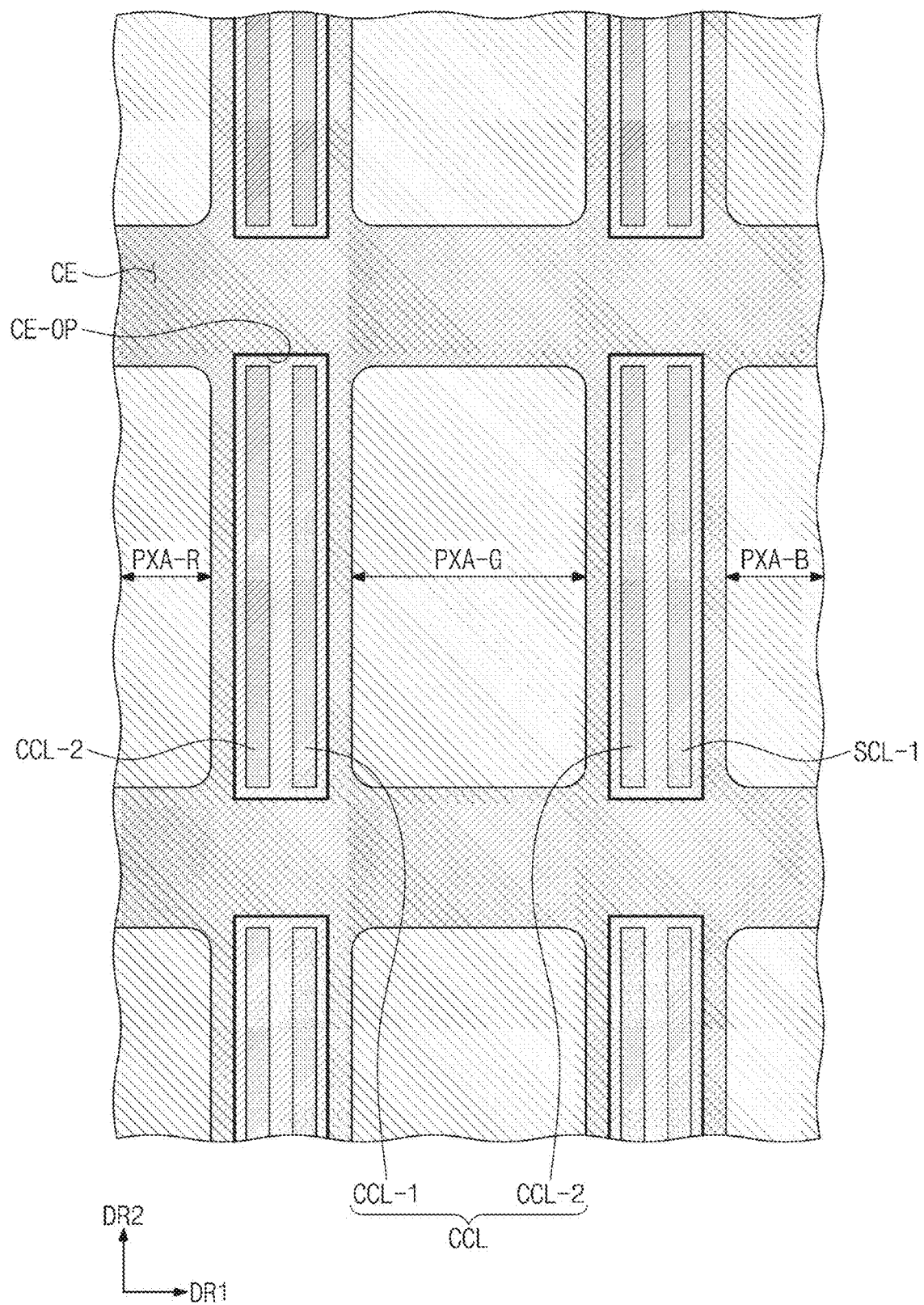

FIGS. 4A and 4B are enlarged plan views illustrating the display panel DP according to an exemplary embodiment. In FIGS. 4A and 4B, the three types of the pixel regions PXA-R, PXA-G, and PXA-B shown in FIG. 2A are illustrated in an enlarged manner, such that the second pixel region PXA-G is located at a center of each figure.

As shown in FIG. 4A, the reflection pattern RFP may be overlapped with the second pixel region PXA-G. The reflection pattern RFP may completely cover the second pixel region PXA-G. The first and second patterns CCL-1 and CCL-2 may be disposed near opposite sides of the second pixel region PXA-G in the first direction DR1. The second pattern CCL-2 for the first pixel region PXA-R may be disposed near the first pattern CCL-1 for the second pixel region PXA-G, and the first pattern SCL-1 for the third pixel region PXA-B may be disposed near the second pattern CCL-2 for the second pixel region PXA-G. The first pattern SCL-1 for the third pixel region PXA-B may be differentiated from the optical conversion pattern CCL, which will be described in more detail with reference to FIG. 5B.

Lengths of the first and second patterns CCL-1 and CCL-2 in the second direction DR2 may correspond to a length of the pixel region PXA-G in the second direction DR2. In the entire region of the display region DA (e.g., see FIG. 1), the first and second patterns CCL-1 and CCL-2 may be disposed for each of the second pixel regions PXA-G. In the display region DA, the first patterns CCL-1 and the second patterns CCL-2 may be arranged in the second direction DR2.

As shown in FIG. 4B, the second electrode CE may be disposed in each of the three kinds of the pixel regions PXA-R, PXA-G, and PXA-B. The second electrode CE, which is disposed in the three kinds of the pixel regions PXA-R, PXA-G, and PXA-B, may be provided as a single body. When viewed in the entirety of the display region DA, the second electrode CE may be a single body, in which a plurality of openings CE-OP are formed to correspond to the optical conversion patterns CCL.

FIGS. 5A to 5K are cross-sectional views illustrating a process of fabricating the display panel DP according to an exemplary embodiment. The following description will be given with reference to FIG. 2B. However, all of three kinds of the pixel regions PXA-R, PXA-G, and PXA-B are illustrated in FIGS. 5A to 5K. Elements disposed below the third insulating layer 30 of the circuit device layer DP-CL are not shown in FIGS. 5A to 5K.

Figure 5A:
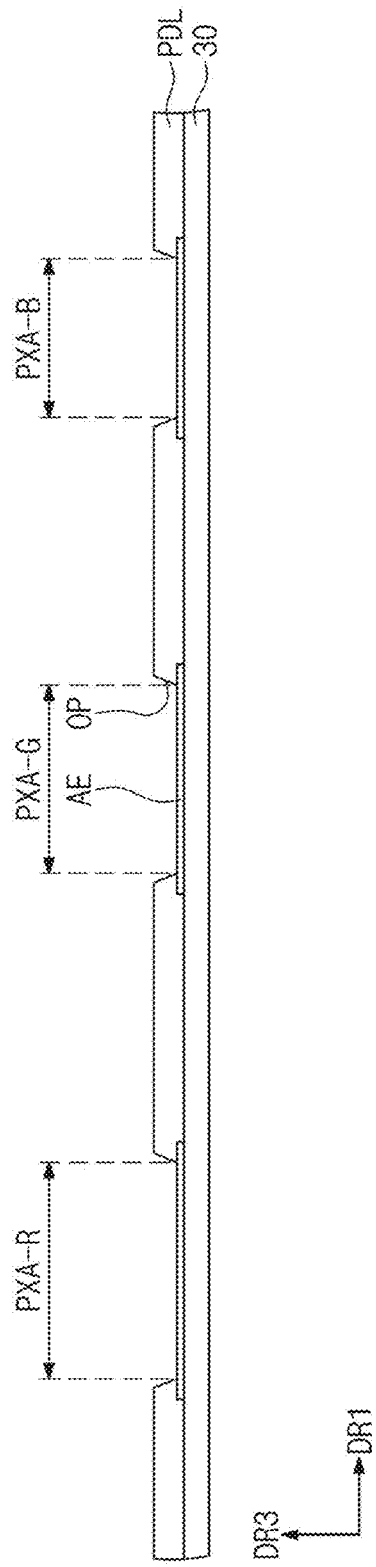

As shown in FIG. 5A, the first electrodes AE of the first, second, and third pixel regions PXA-R, PXA-G, and PXA-B may be formed on the third insulating layer 30. The first electrodes AE may be formed by forming a conductive layer and then patterning the conductive layer. As shown in FIG. 5A, the first electrode AE of the first pixel region PXA-R may have the largest area, and the first electrode AE of the third pixel region PXA-B may have the smallest area.

The pixel definition layer PDL may be formed on the third insulating layer 30. For example, an organic layer may be formed, and then, a photolithography process may be performed to form the pixel definition layer PDL and the opening OP.

Figure 5B:
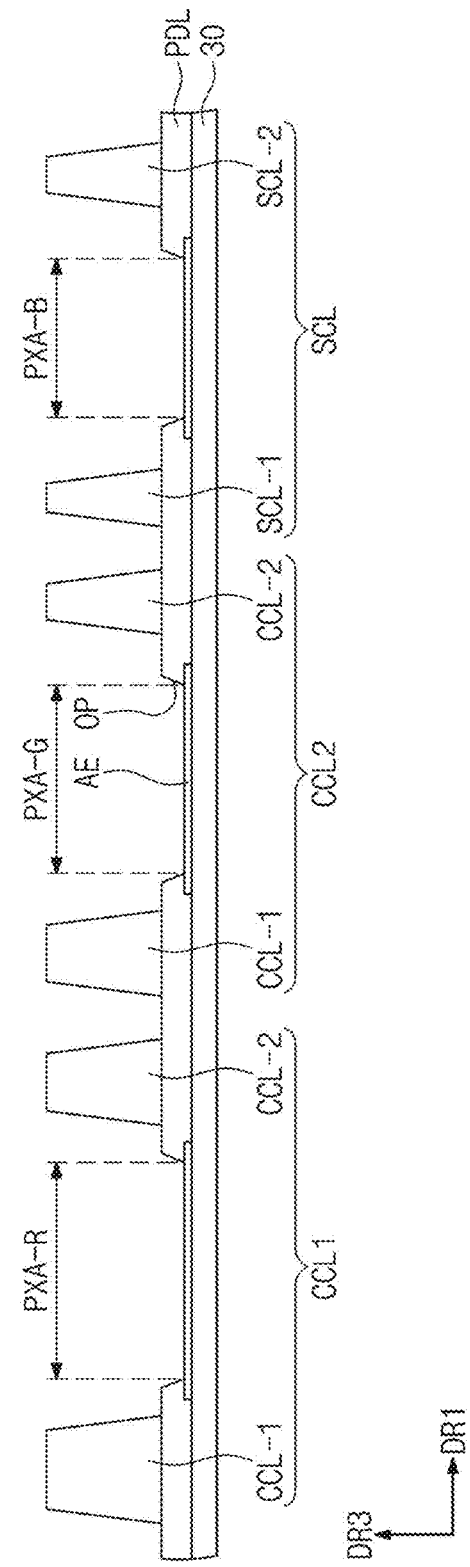

As shown in FIG. 5B, optical conversion patterns CCL1 and CCL2 may be formed on the pixel definition layer PDL. The optical conversion pattern CCL1 (hereinafter, a first optical conversion pattern) corresponding to the first pixel region PXA-R and the optical conversion pattern CCL2 (hereinafter, a second optical conversion pattern) corresponding to the second pixel region PXA-G may be sequentially formed. The first optical conversion pattern CCL1 and the second optical conversion pattern CCL2 may include different quantum dots, which are used to generate different colors of light.

An optical pattern SCL corresponding to the third pixel region PXA-B may be formed on the pixel definition layer PDL. The optical pattern SCL may not include the quantum dot. The optical pattern SCL may include a base resin and a scattering particle, which is dispersed or dispersed in the base resin. The scattering particle may be a nano particle, which may include titanium oxide (TiO2) or silica. In some exemplary embodiments, the scattering particle may be omitted from the optical pattern SCL, and the first optical conversion pattern CCL1 and the second optical conversion pattern CCL2 may further include the scattering particle.

As shown in FIG. 5C, the first light blocking pattern LSP1 of the metal layer may be formed. The metal layer may be disposed between the first optical conversion pattern CCL1, the second optical conversion pattern CCL2, and the optical pattern SCL. The metal layer may be formed, and then, the patterning process may be performed to form the first light blocking pattern LSP1 in contact with the first optical conversion pattern CCL1, the second optical conversion pattern CCL2, and the optical pattern SCL. The metal layer may be formed by a sputtering process.

As shown in FIG. 5D, other elements of the light emitting element OLED may be further formed. At least the light emitting layer EML and the second electrode CE may be formed. The same light emitting layer EML may be formed on the first, second, and third pixel regions PXA-R, PXA-G, and PXA-B through a deposition process. At least one of the hole control layer HCL and the electron control layer ECL may be further formed.

The second electrode CE may be formed by forming and patterning a conductive layer. The second electrode CE may be formed to have a plurality of the openings CE-OP, as described with reference to FIG. 4B.

Figure 5E:
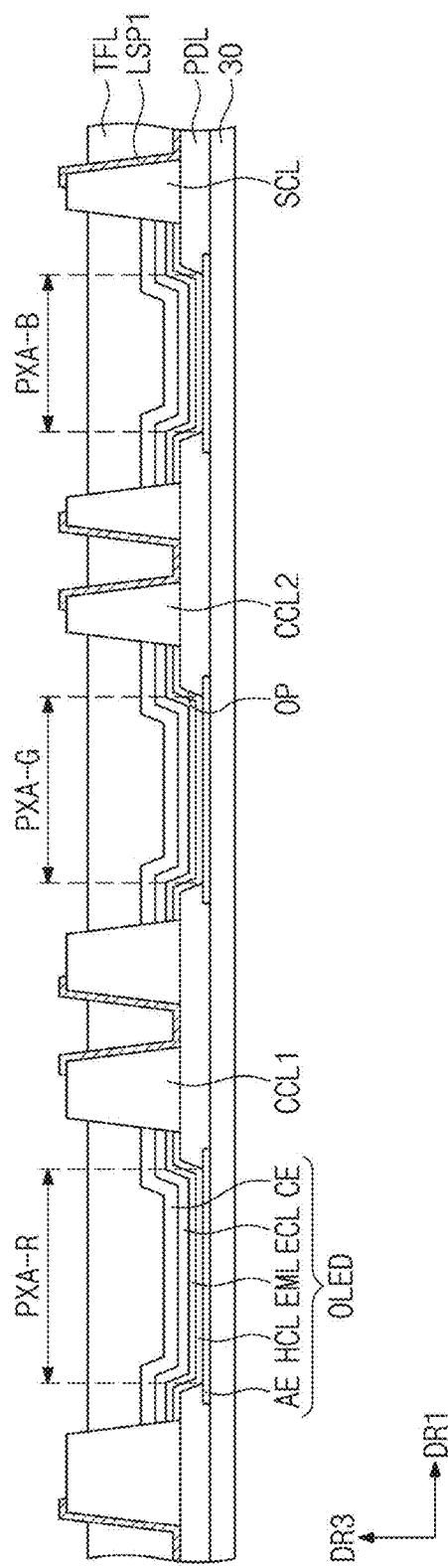

As shown in FIG. 5E, the upper insulating layer TFL may be formed on the second electrode CE. An inorganic layer may be formed by depositing an inorganic material, and an organic layer may be formed by depositing an organic monomer. The process of depositing inorganic material and the organic material may be performed several times.

Figure 5F:
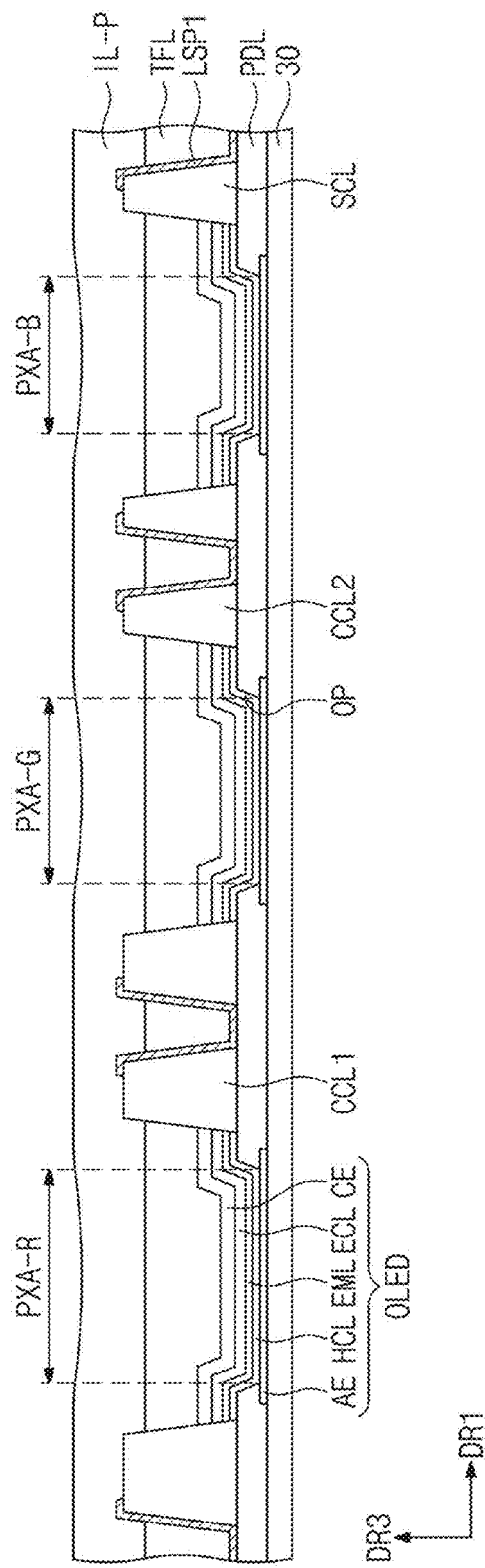

As shown in FIG. 5F, a preliminary insulating layer IL-P may be formed. The preliminary insulating layer IL-P may be formed by coating and drying an organic material. The preliminary insulating layer IL-P may cover the optical conversion pattern CCL and the first light blocking pattern LSP1.

Figure 5H:
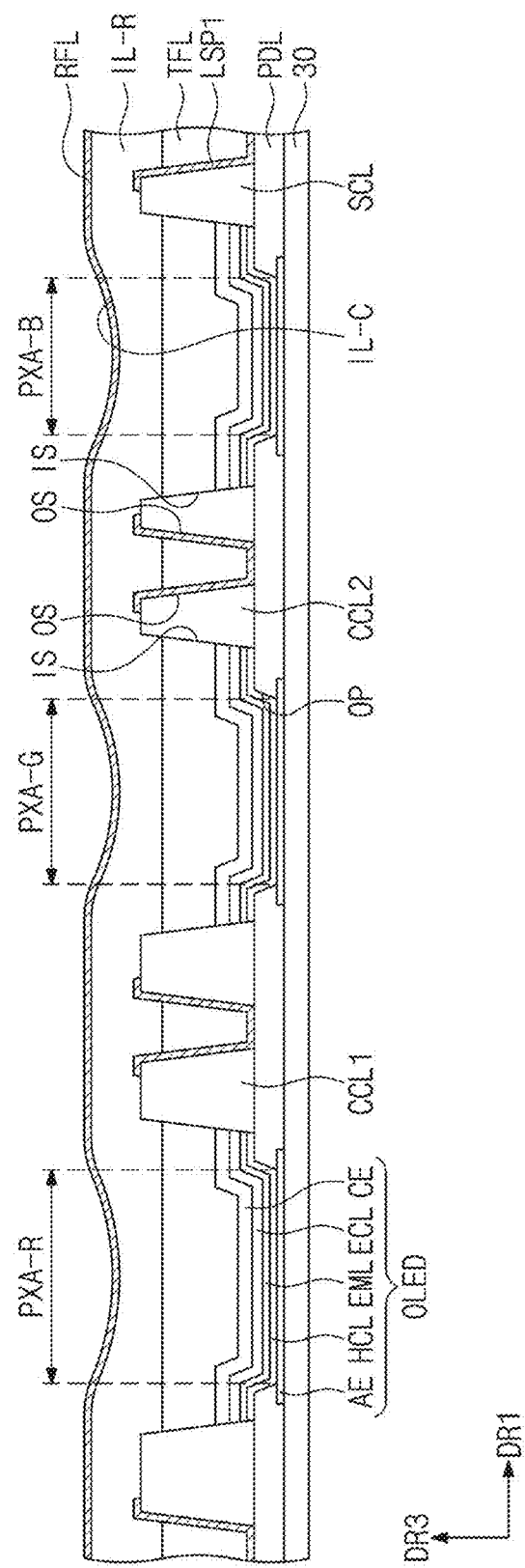
Figure 51:
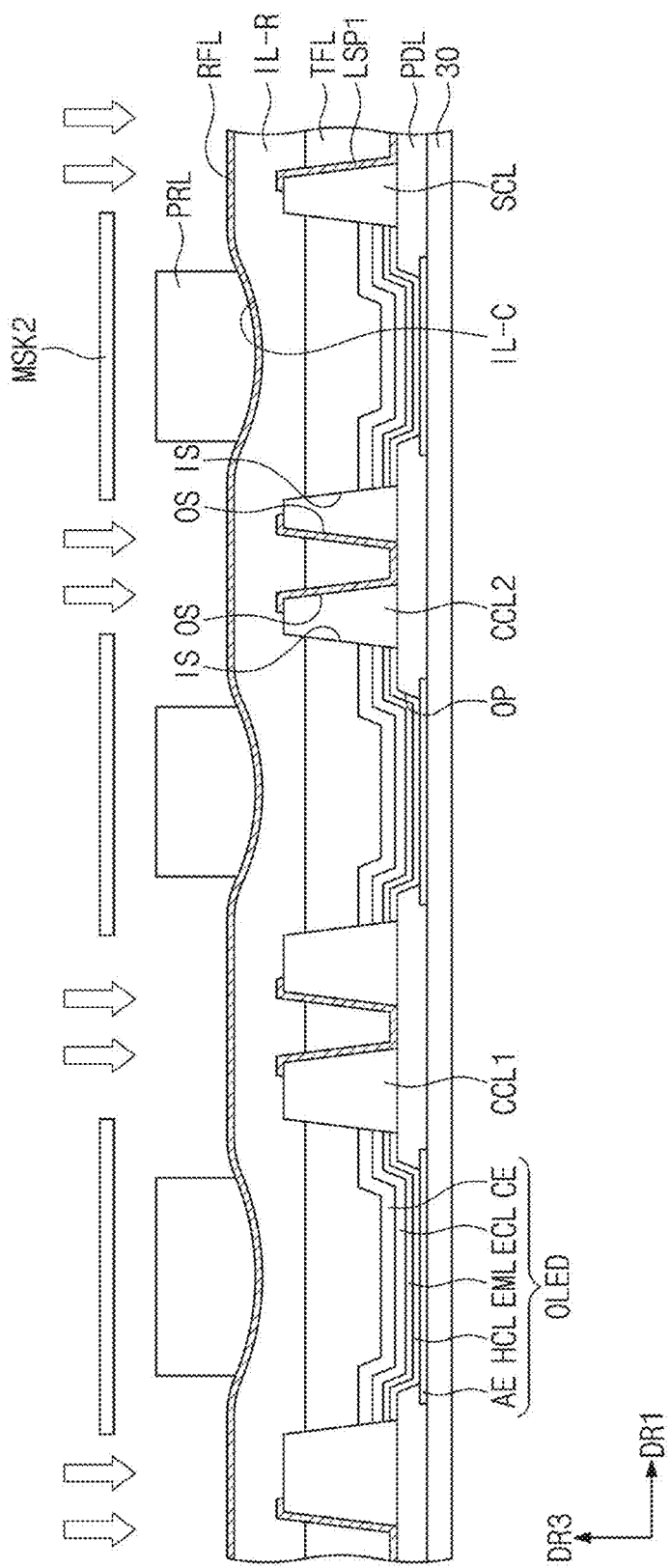

As shown in FIGS. 5G and 5H, a cavity IL-C may be formed in the preliminary insulating layer IL-P. A portion of the preliminary insulating layer IL-P may be exposed using a mask MSK1 and may be developed to form the cavity IL-C. The cavity IL-C may be overlapped with each of the three kinds of the pixel regions PXA-R, PXA-G, and PXA-B. FIG. 5G illustrates a lithography process performed in a negative manner, and in this case, a non-exposed portion of the preliminary insulating layer IL-P may be partially removed. Such a cavity IL-C may be suitable for forming the reflection pattern RFP having the shapes shown in FIGS. 3C and 3D.

In another exemplary embodiment, by changing the design of the mask, it may be possible to partially remove the preliminary insulating layer IL-P corresponding to the peripheral region NPXA. The cavity IL-C may be formed to be overlapped with the peripheral region NPXA and to have the largest depth in the peripheral region NPXA. In this case, a portion of the preliminary insulating layer IL-P, which is overlapped with the three kinds of the pixel regions PXA-R, PXA-G, and PXA-B, may have a relatively protruding structure, compared with a portion of the preliminary insulating layer IL-P overlapped with the peripheral region NPXA. Such a preliminary insulating layer IL-P may be suitable for forming the reflection pattern RFP having the shapes shown in FIGS. 3E and 3F. Although not shown, the cavity IL-C may be formed by performing a photolithography process in a positive manner.

As shown in FIG. 5H, a reflection layer RFL may be formed on a first insulating layer IL-R, in which the cavity IL-C is formed. The reflection layer RFL may include a metal layer formed by a sputtering process.

As shown in FIG. 5I, the reflection layer RFL may be patterned by a photolithography process performed in a positive manner. As such, the reflection pattern RFP shown in FIG. 5J may be formed. A mask MSK2 and a photoresist PRL may be used in the photolithography process in this step, unlike that shown in FIG. 5G.

Figure 5J:
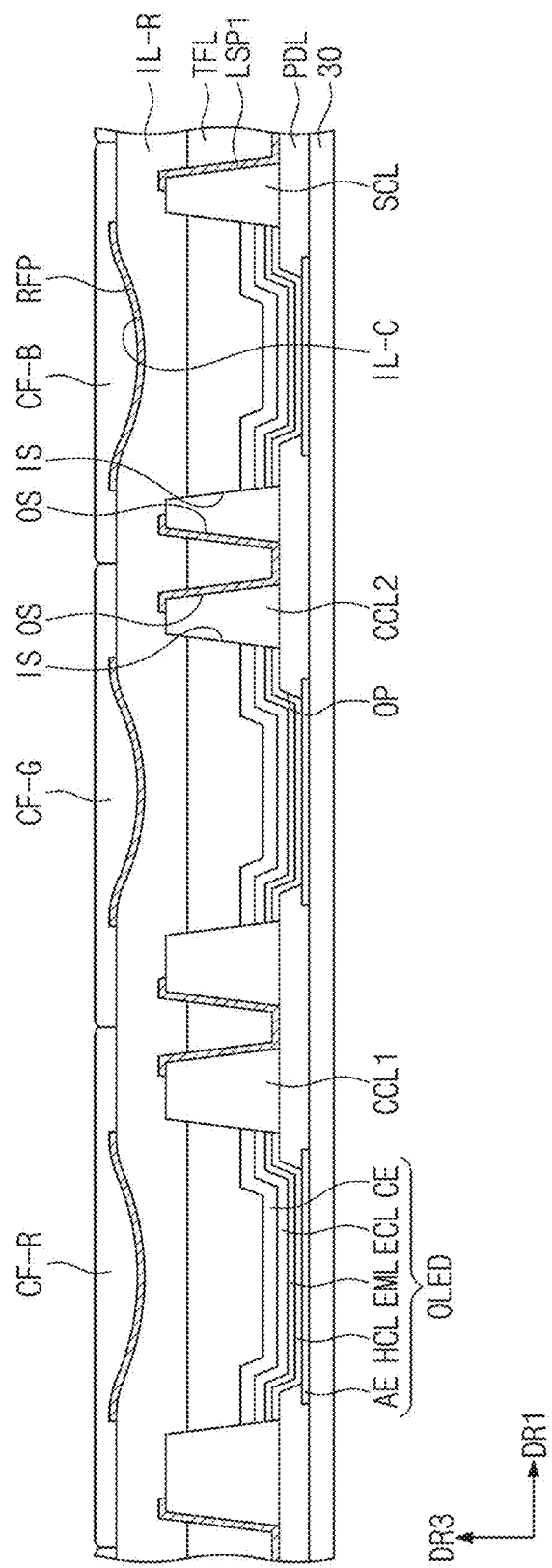

As shown in FIG. 5J, the color filters CF-R, CF-G, and CF-B may be formed by a photolithography process. In an exemplary embodiment, three kinds of the color filters CF-R, CF-G, and CF-B may be formed by performing a photolithography process three times. A red color filter, a green color filter, and a blue color filter may be formed to correspond to the first to third pixel regions PXA-R, PXA-G, and PXA-B, respectively.

Figure 5K:
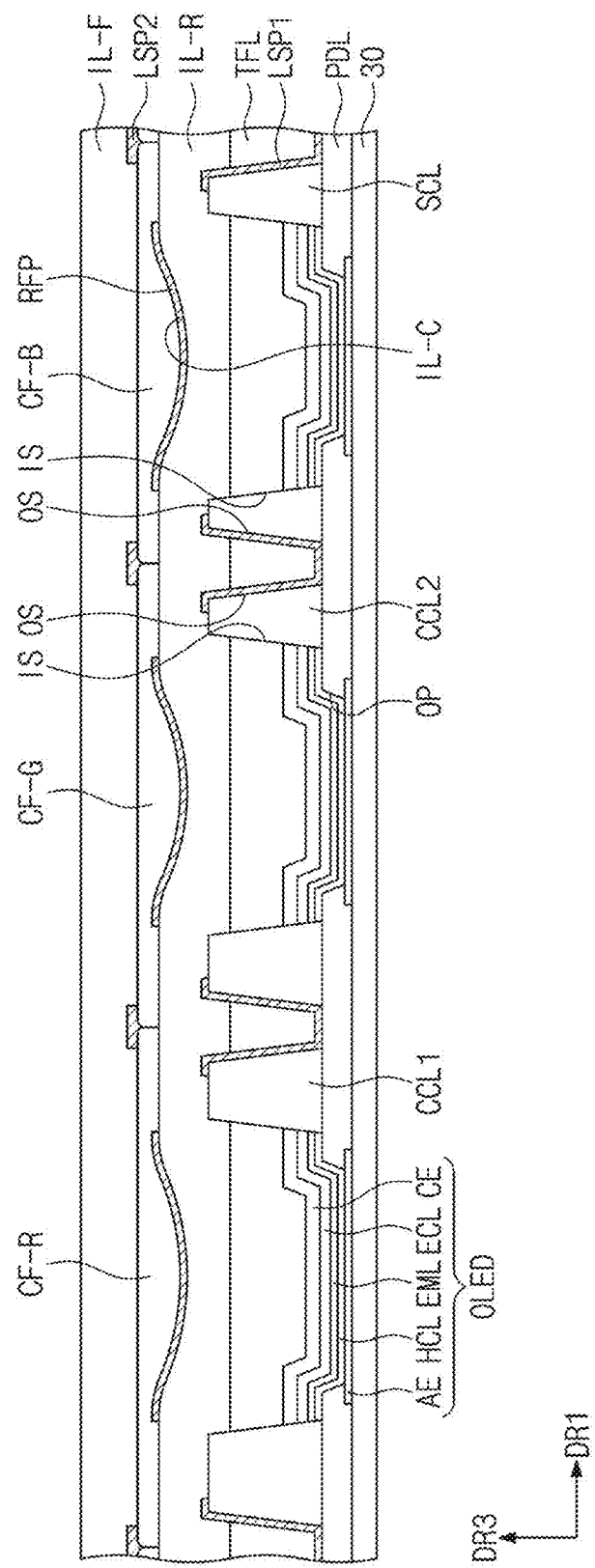

As shown in FIG. 5K, the second light blocking pattern LSP2 may be formed by a photolithography process. Thereafter, the second insulating layer IL-F may be formed. An organic material may be coated to form the second insulating layer IL-F having a flat top surface.

Figure 6:
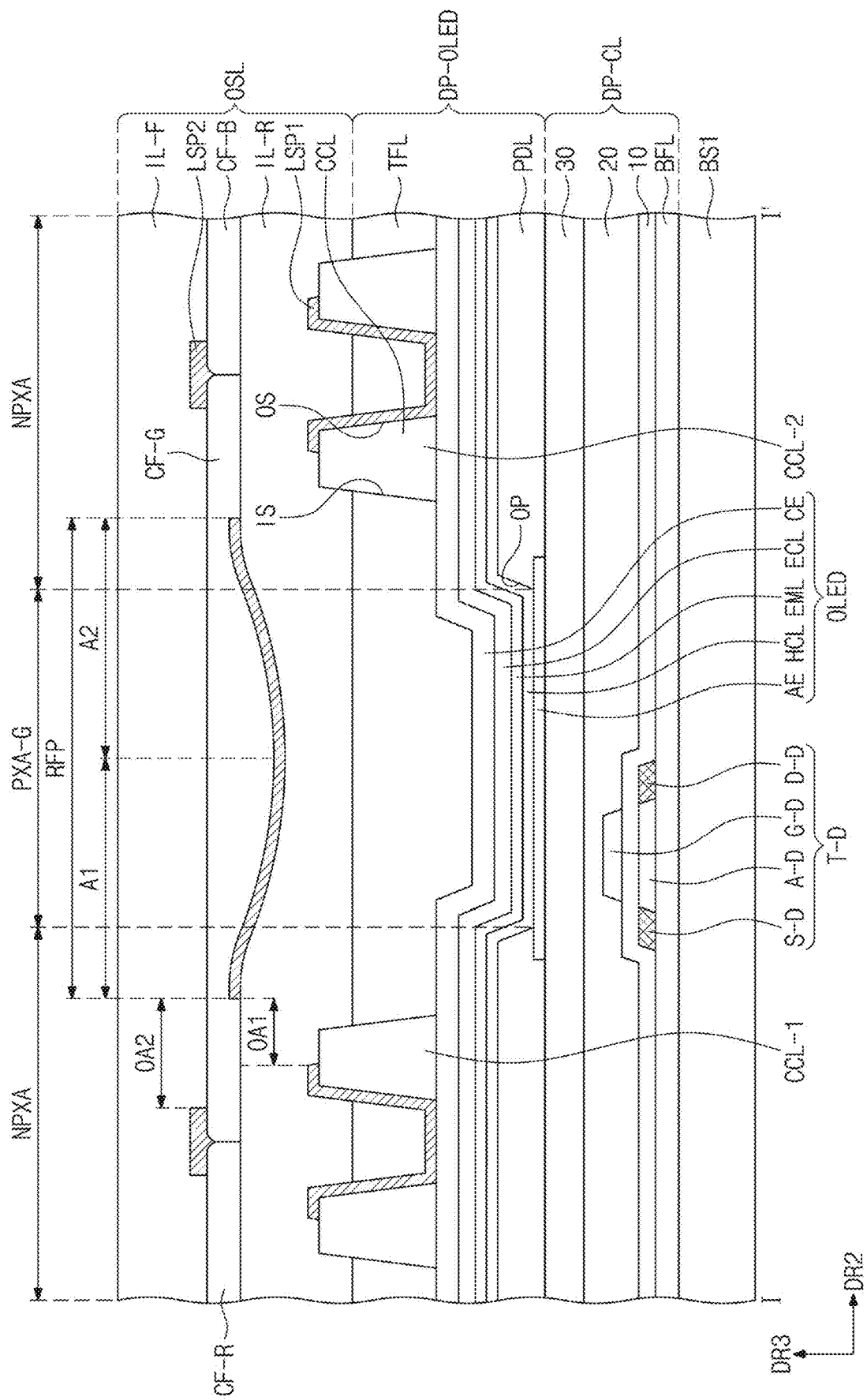
FIG. 6 is a cross-sectional view illustrating a display panel according to an embodiment.

FIG. 6 is a cross-sectional view illustrating the display panel DP according to another exemplary embodiment. FIG. 6 may be a cross-sectional view taken along line I-I' of FIG. 2A according to another exemplary embodiment. Elements of the display DP previously described with reference to FIG. 2A may be identified by the same reference number, and thus, repeated descriptions thereof will be omitted.

As shown in FIG. 6, the hole control layer HCL, the electron control layer ECL, and the second electrode CE may be disposed on the pixel definition layer PDL and in the peripheral region NPXA. The optical conversion pattern CCL may be directly disposed on the second electrode CE. A portion of the first light blocking pattern LSP1 may be in contact with the second electrode CE. The light emitting layer EML may be further disposed on the pixel definition layer PDL and in the peripheral region NPXA. In some exemplary embodiments, at least one of the hole control layer HCL, the electron control layer ECL, and the second electrode CE, which are disposed on the pixel definition layer PDL and in the peripheral region NPXA, may be omitted.

Figure 7A:
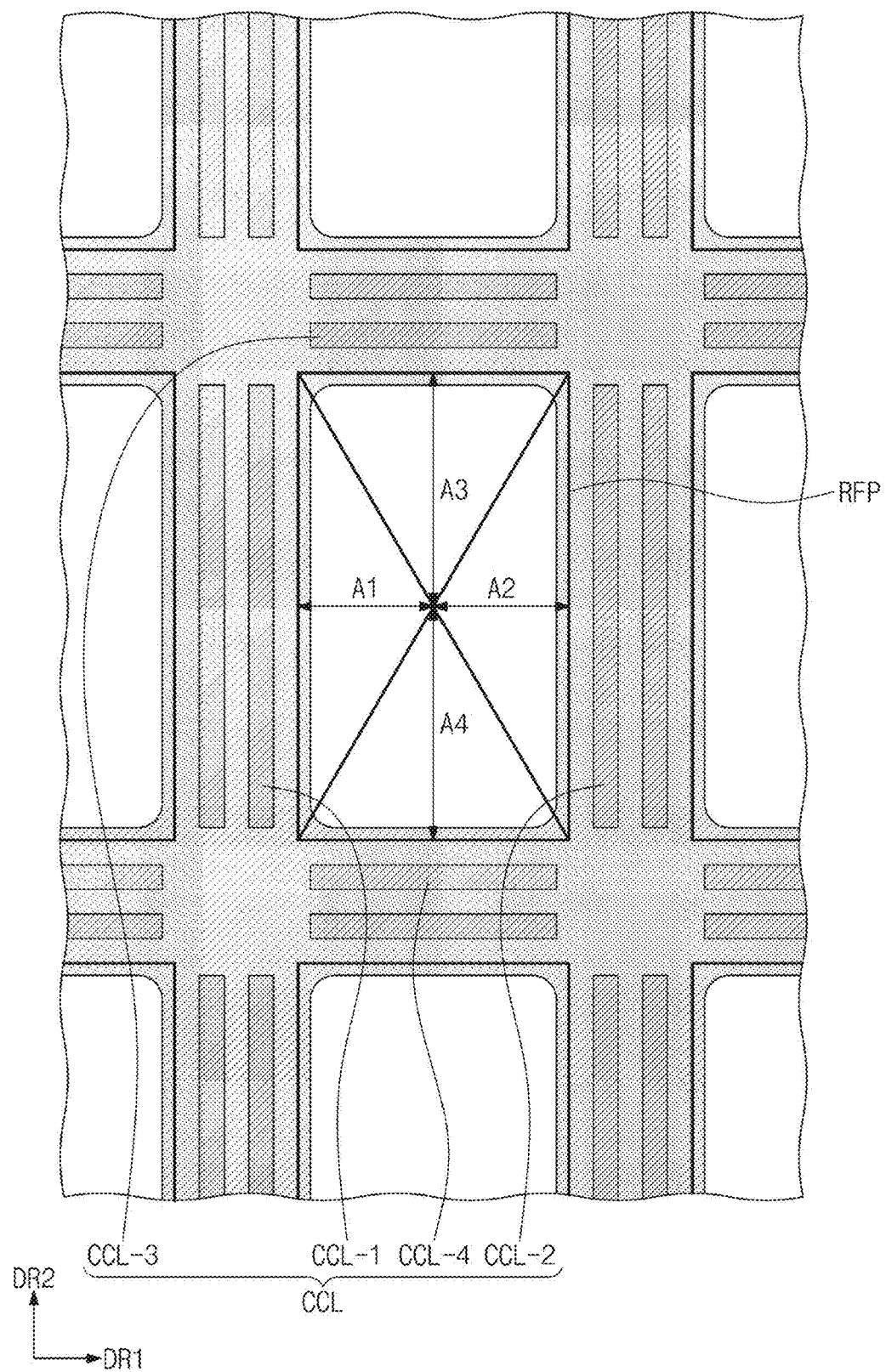
FIG. 7A is an enlarged plan view illustrating a display panel according to an embodiment.
Figure 7B:
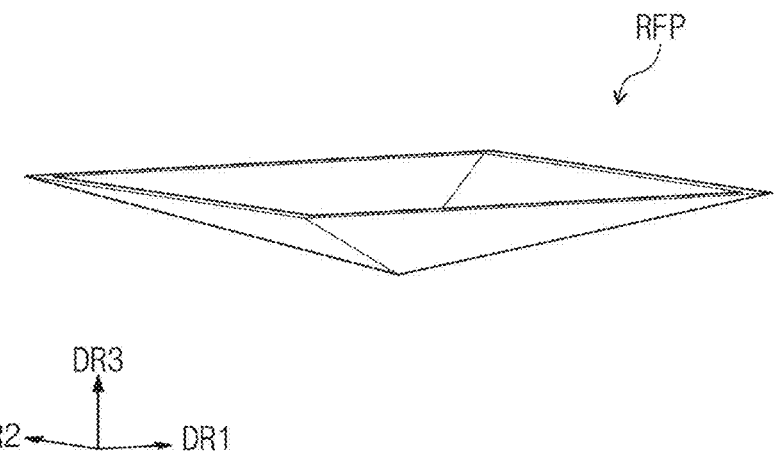
FIGS. 7B and 7C are perspective views illustrating reflection patterns according embodiments.
Figure 7C:
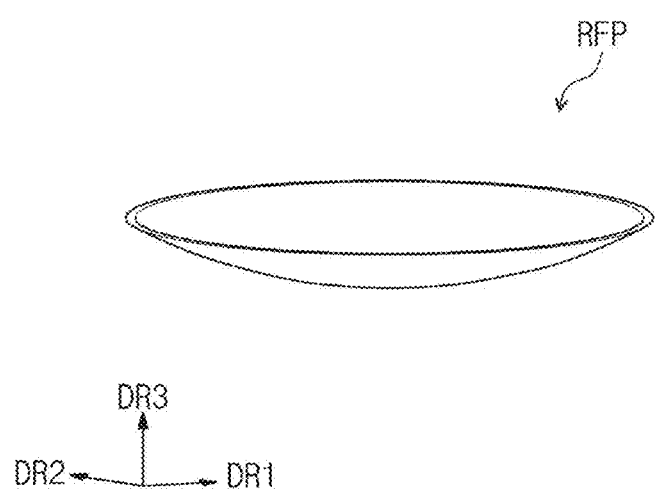

FIG. 7A is an enlarged plan view illustrating the display panel DP according to an exemplary embodiment. FIGS. 7B and 7C are perspective views illustrating the reflection pattern RFP according to exemplary embodiments. FIG. 7A illustrates a plan view corresponding to FIG. 4A. Elements of the display panel DP previously described with reference to FIG. 4A may be identified by the same reference number, and thus, repeated descriptions thereof will be omitted.

As shown in FIG. 7A, the optical conversion pattern CCL may further include a third pattern CCL-3 and a fourth pattern CCL-4, which are spaced apart from each other in the second direction DR2 and are respectively disposed near opposite sides of the second pixel region PXA-G. The third pattern CCL-3 and the fourth pattern CCL-4 may be disposed in the peripheral region NPXA, which is disposed between two adjacent ones of the second pixel regions PXA-G in the second direction DR2.

The reflection pattern RFP may further include a third region A3, which provides the source light to the third pattern CCL-3, and a fourth region A4, which provides the source light to the fourth pattern CCL-4. In some exemplary embodiments, at least two of the first pattern CCL-1, the second pattern CCL-2, and the third pattern CCL-3, and the fourth pattern CCL-4 may be connected to each other.

In another exemplary embodiment, the optical conversion pattern CCL may form a closed line. When the optical conversion pattern CCL encloses the second pixel region PXA-G, it may be possible to reduce an amount of the source light being lost.

As shown in FIG. 7B, the reflection pattern RFP may include a lens surface having a rectangular pyramid shape. As shown in FIG. 7C, the reflection pattern RFP may include a lens surface having an elliptical shape. In some exemplary embodiments, the reflection pattern RFP may include a lens surface having a polygonal, but not rectangular, pyramid shape, or a semi-spherical shape. A portion of the lens surface having the afore-mentioned shape may correspond to an inclined surface corresponding to the first pattern CCL-1, the second pattern CCL-2, and the third pattern CCL-3, and the fourth pattern CCL-4.

FIG. 8A is a cross-sectional view illustrating the display panel DP according to an exemplary embodiment. FIG. 8B is a cross-sectional view illustrating a process of fabricating the display panel DP according to an exemplary embodiment. Elements of the display panel DP previously described with reference to FIGS. 1A to 7C may be identified by the same reference number, and thus, repeated descriptions thereof will be omitted.

Referring to FIG. 8A, the first light blocking pattern LSP1 of the metal layer shown in FIG. 2B may be replaced with a first light blocking pattern LSP10 including a black coloring agent. The first light blocking pattern LSP10 with a black coloring agent may be a black matrix. The black matrix may be disposed between the first and second patterns CCL-1 and CCL-2. In addition, the black matrix may be disposed between the second pattern CCL-2 and the first pattern SCL-1. The first light blocking pattern LSP1 and the second light blocking pattern LSP2 may be aligned to each other.

Unlike the metal layer shown in FIG. 5C, the first light blocking pattern LSP10 of the black matrix type according to the illustrated exemplary embodiment may be formed between the patterns CCL-1, CCL-2, SCL-1, and SCL-2, as shown in FIG. 8B. Subsequent processes may be performed in the same manner as those described with reference to FIGS. 5D to 5K. The first light blocking pattern LSP10 may be formed by patterning an organic layer with the black coloring agent.

Figure 9A:
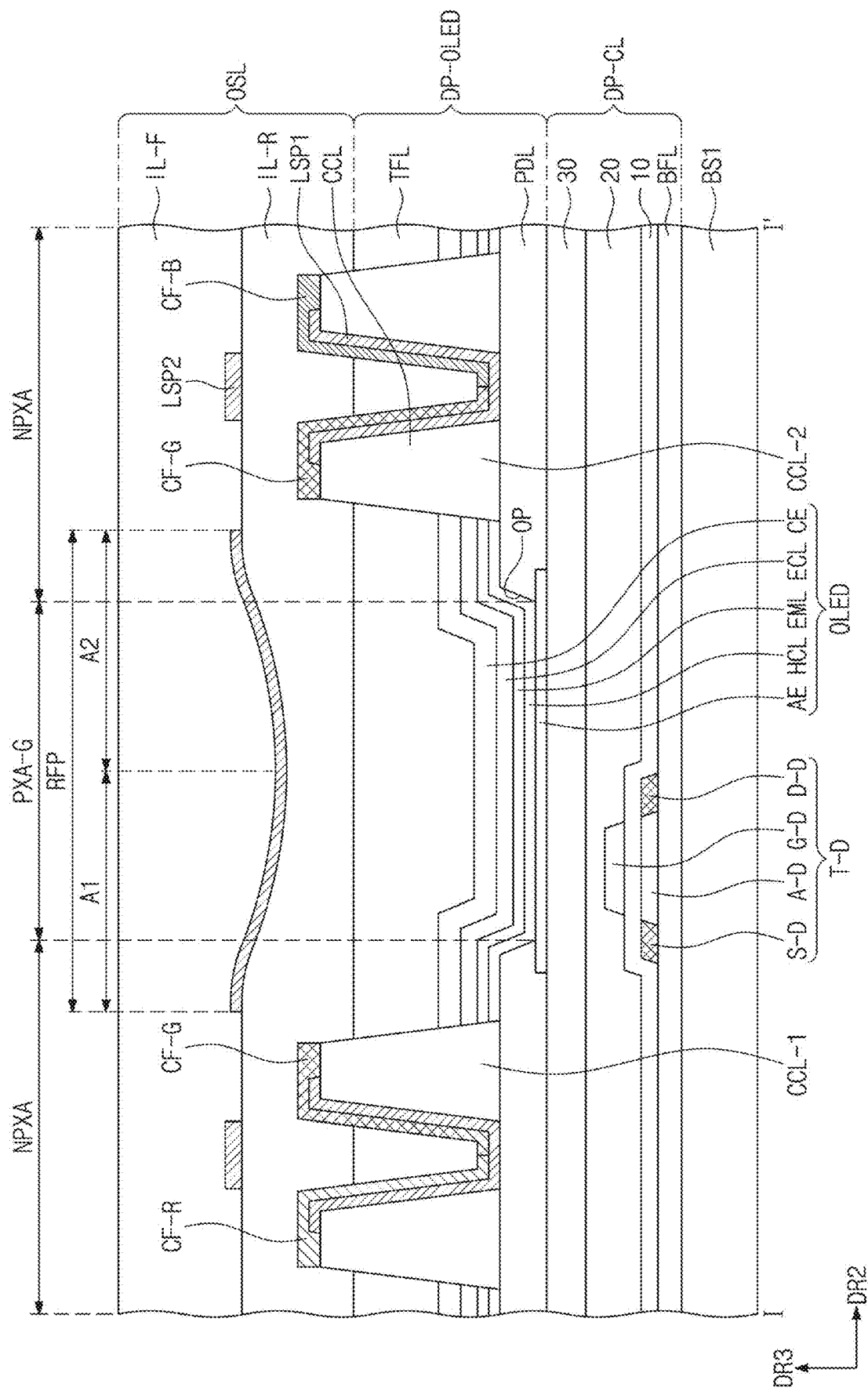
FIG. 9A is a cross-sectional view illustrating a display panel according to an embodiment.
Figure 9B:
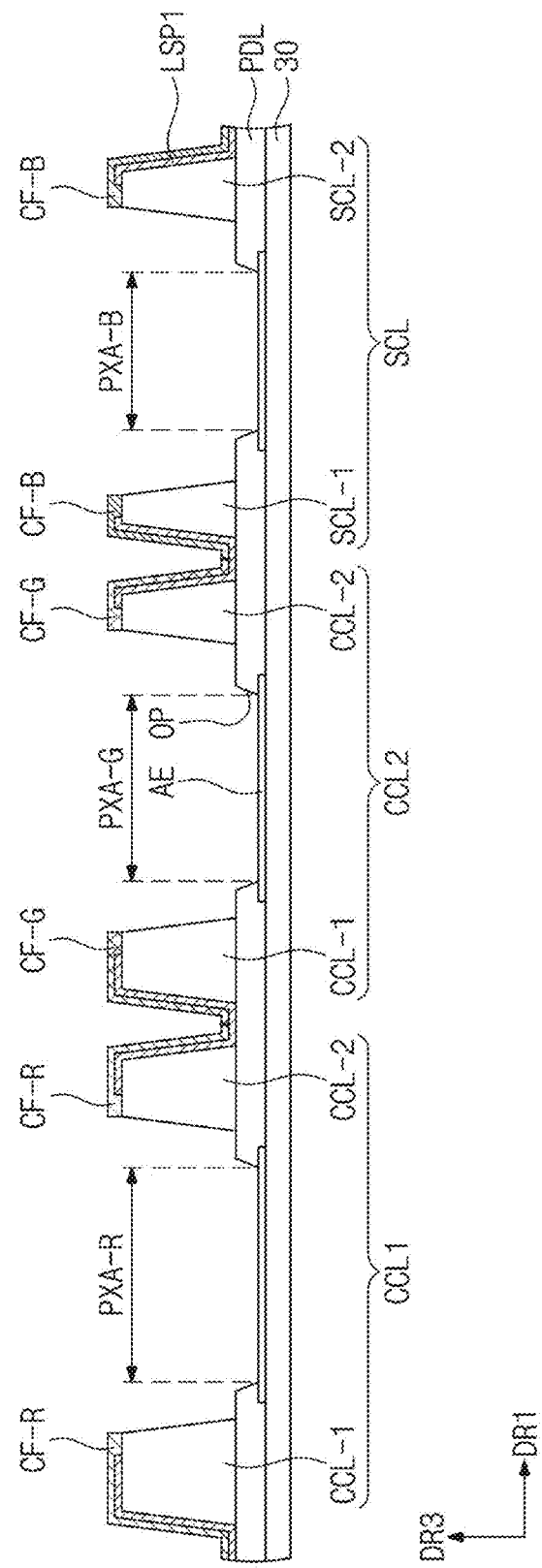
FIG. 9B is a cross-sectional view illustrating a process of fabricating a display panel according to an embodiment.

FIG. 9A is a cross-sectional view illustrating the display panel DP according to an exemplary embodiment. FIG. 9B is a cross-sectional view illustrating a process of fabricating the display panel DP according to an exemplary embodiment. Element of the display panel DP previously described with reference to FIGS. 1A to 7C may be identified by the same reference number, and thus, repeated descriptions thereof will be omitted.

Referring to FIG. 9A, the positions of the color filters CF-R, CF-G, and CF-B of FIG. 2B may be changed. At least a portion of the color filters CF-R, CF-G, and CF-B may be provided between the optical conversion pattern CCL and the first organic layer IL-R. A portion of the second color filter CF-G may be disposed on the first and second patterns CCL-1 and CCL-2, and another portion thereof may be disposed on the outer side surface OS. The another portion of the color filter CF-G may cover the first light blocking pattern LSP1 of the metal layer. A portion of the third color filter CF-B may be disposed on the first pattern SCL-1 and the second pattern SCL-2, and another portion thereof may be disposed on the outer side surface OS.

FIG. 9B illustrates the color filters CF-R, CF-G, and CF-B formed after the step of FIG. 5C. However, the inventive concepts are not limited thereto, and in some exemplary embodiments, the color filters CF-R, CF-G, and CF-B may be formed between the step of FIG. 5C and the step of FIG. 5E. Subsequent processes may be performed in the same manner as those described with reference to FIGS. 5D to 5K. However, in some exemplary embodiments, the process of FIG. 5J may be omitted, and the second light blocking pattern LSP2 may be directly disposed on the first organic layer IL-R.

Figure 10A:
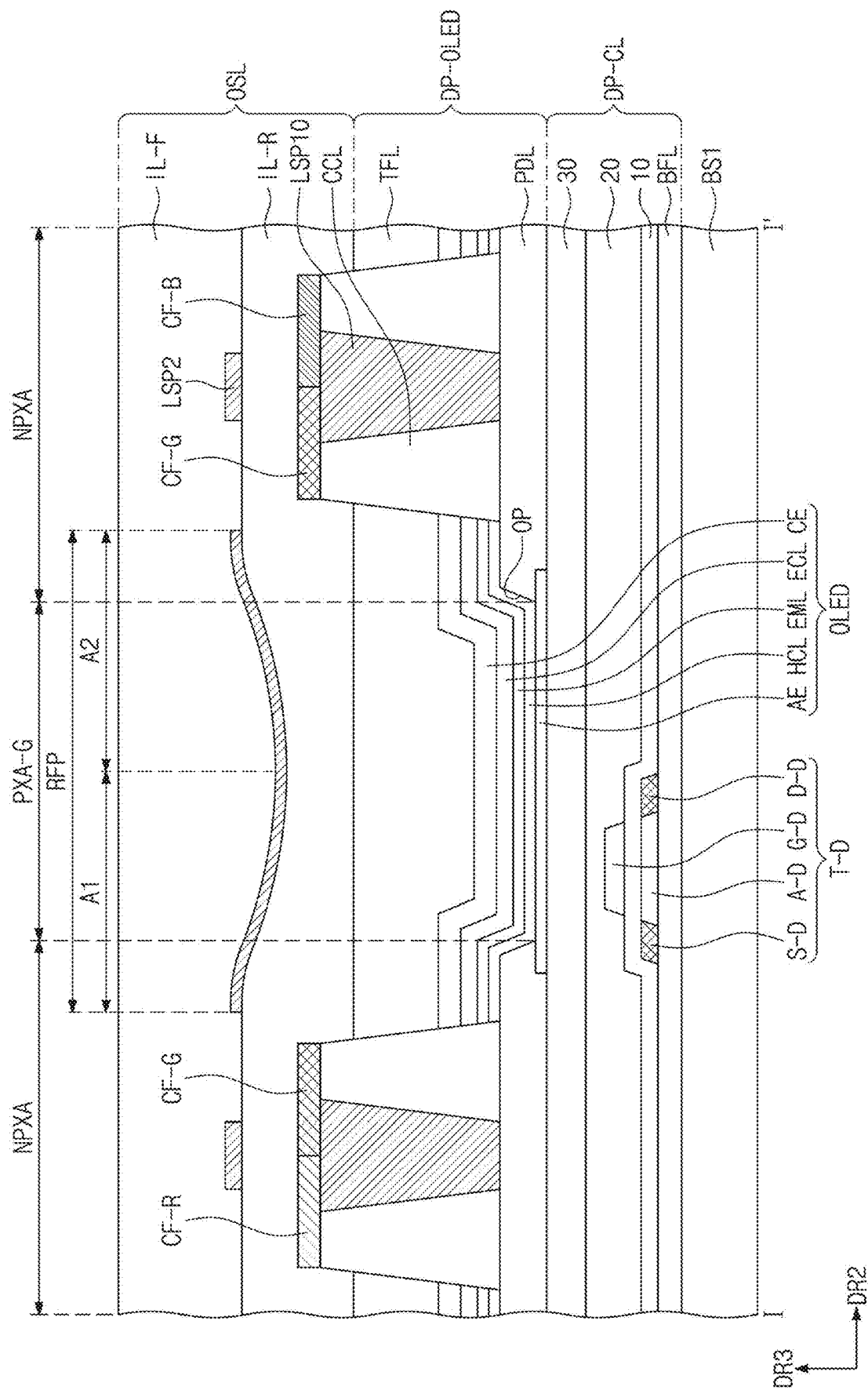
FIG. 10A is a cross-sectional view illustrating a display panel according to an embodiment.
Figure 10B:
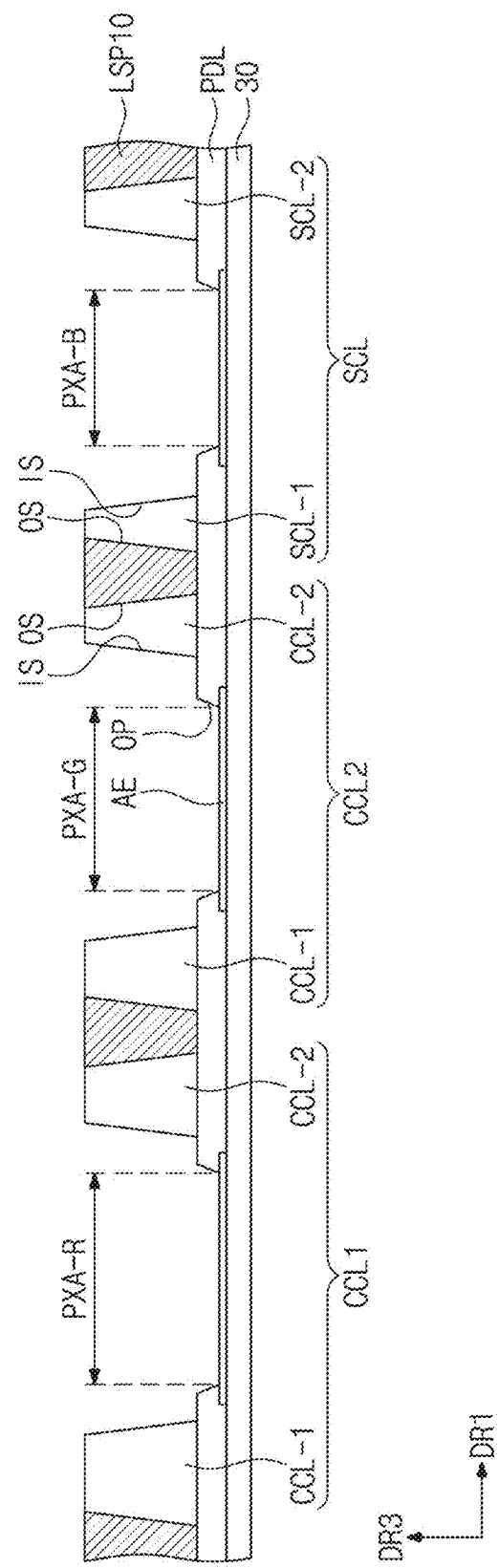
FIGS. 10B and 10C are cross-sectional views illustrating a process of fabricating a display panel according to an embodiment.

FIG. 10A is a cross-sectional view illustrating the display panel DP according to an exemplary embodiment. FIG. 10B is a cross-sectional view illustrating a process of fabricating the display panel DP according to an exemplary embodiment. Elements of the display panel DP previously described with reference to FIGS. 1A to 7C may be identified by the same reference number, and thus, repeated descriptions thereof will be omitted.

Referring to FIG. 10A, the first light blocking pattern LSP1 of the metal layer of FIG. 2B may be replaced with the first light blocking pattern LSP1 including a black coloring agent. In addition, the positions of the color filters CF-R, CF-G, and CF-B shown in FIG. 2B may be changed.

The black matrix may be disposed between the first pattern CCL-1 or SCL-1 and the second pattern CCL-2 or SCL-2. The black matrix may fill a space between the first pattern CCL-1 or SCL-1 and the second pattern CCL-2 or SCL-2, and may provide a substantially flat top surface, along with the optical conversion pattern CCL or the optical pattern SCL. The color filters CF-R, CF-G, and CF-B may be disposed on top surfaces of the black matrix and the optical conversion pattern or optical pattern CCL or SCL.

Figure 10C:
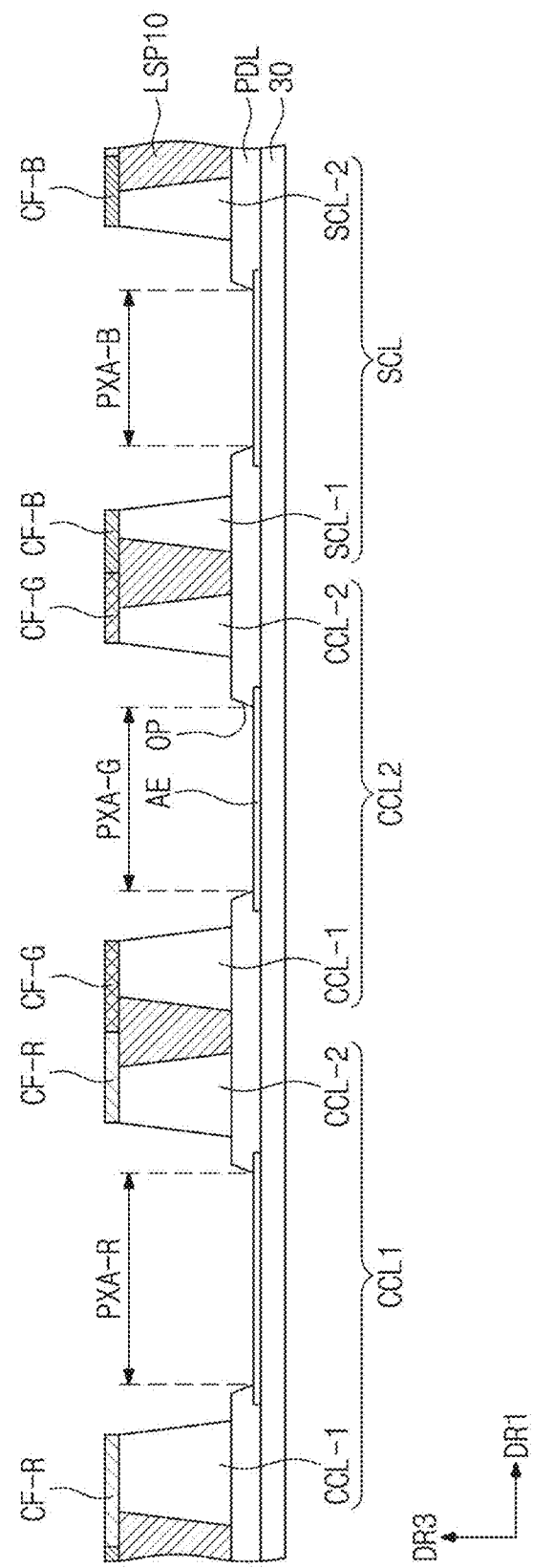

Unlike the metal layer in FIG. 5C, the black matrix may be formed between the patterns CCL-1, CCL-2, SCL-1, and SCL-2, as shown in FIG. 10B. Thereafter, the color filters CF-R, CF-G, and CF-B may be formed, as shown in FIG. 10C. Subsequent processes may be performed in the same manner as those described with reference to FIGS. 5D to 5K. However, in some exemplary embodiments, the process of FIG. 5J may be omitted, and the second light blocking pattern LSP2 may be directly disposed on the first organic layer IL-R.

According to exemplary embodiments, a display panel may include a reflection structure that may increase an amount of light incident into a color control layer. Since the amount of light incident into the color control layer is increased, the amount of light converted from the source light may be increased. In this manner, the display panel may have an improved optical efficiency.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
   a light emitting element configured to emit a source light and including a first electrode, a light emitting layer disposed on the first electrode, and a second electrode disposed on the light emitting layer;
   a pixel definition layer including an opening exposing at least a portion of the first electrode;
   an optical conversion pattern disposed on the pixel definition layer;
   a reflection pattern disposed on the light emitting element and having an inclined surface; and
   a first light blocking pattern, which is disposed outside at least the optical conversion pattern when viewed in a plan view,
   wherein a top surface of the optical conversion pattern that faces away from the light emitting element is disposed at a lower elevation than the reflection pattern with respect to the light emitting element.

2. The display panel of claim 1, wherein the optical conversion pattern is in contact with the pixel definition layer.

3. The display panel of claim 1, wherein:
   the light emitting element further comprises at least one of a hole control layer and an electron control layer overlapping with the light emitting layer; and
   a portion of at least one of the hole control layer and the electron control layer is disposed between the pixel definition layer and the optical conversion pattern.

4. The display panel of claim 1, further comprising a color filter configured to transmit light converted from the source light by the optical conversion pattern.

5. The display panel of claim 4, wherein:
   the color filter is disposed on the reflection pattern; and
   the color filter overlaps the reflection pattern and the optical conversion pattern, when viewed in a plan view.

6. The display panel of claim 4, further comprising a first organic layer disposed on the optical conversion pattern and below the reflection pattern, wherein at least a portion of the color filter is disposed between the optical conversion pattern and the first organic layer.

7. The display panel of claim 6, further comprising a second organic layer disposed on the reflection pattern and overlapping the first organic layer.

8. The display panel of claim 1, wherein the reflection pattern and the first light blocking pattern are spaced apart from each other, when viewed in a plan view.

9. The display panel of claim 1, wherein the first light blocking pattern comprises a metal layer in contact with an outer side surface of the optical conversion pattern.

10. The display panel of claim 1, wherein the first light blocking pattern comprises a black coloring agent in contact with an outer side surface of the optical conversion pattern.

11. The display panel of claim 1, further comprising:
an organic layer disposed on the optical conversion pattern below the reflection pattern; and
a second light blocking pattern disposed on the organic layer and overlapping with the first light blocking pattern when viewed in a plan view.

12. The display panel of claim 11, further comprising at least one inorganic layer disposed between the organic layer and the light emitting element.

13. The display panel of claim 12, wherein:
the optical conversion pattern comprises a first pattern disposed at a side of the first electrode, and a second pattern disposed at an opposite side of the first electrode, when viewed in a plan view; and
the inorganic layer is disposed between the first pattern and the second pattern, when viewed in a plan view.

14. The display panel of claim 1, wherein:
the reflection pattern comprises a lens surface having at least one of a spherical shape, elliptical, lenticular shape, and polygonal pyramid shape; and
the lens surface comprises the inclined surface.

15. The display panel of claim 1, wherein:
the optical conversion pattern comprises a first pattern and a second pattern disposed at opposite sides of the first electrode when viewed in a plan view;
the inclined surface comprises a first region corresponding to the first pattern and a second region corresponding to the second pattern; and
the first region and the second region are provided as a single body.

16. A display panel, comprising:
a first light emitting element and a second light emitting element configured to emit a source light, respectively, each light emitting element including a first electrode, a light emitting layer disposed on the first electrode, and a second electrode disposed on the light emitting layer;
a pixel definition layer including a first opening and a second opening exposing at least a portion of the first electrode of a corresponding one of the first and second light emitting elements;
a first optical conversion pattern disposed on the pixel definition layer and disposed outside the first electrode of the first light emitting element when viewed in a plan view;
a second optical conversion pattern disposed on the pixel definition layer and disposed outside from the first electrode of the second light emitting element when viewed in a plan view;

a first reflection pattern and a second reflection pattern each including an inclined surface and disposed on the first light emitting element and second light emitting element, respectively; and
an insulating layer overlapping the first optical conversion pattern, the second optical conversion pattern, the first reflection pattern, and the second reflection pattern, and disposed on the first optical conversion pattern and the second optical conversion pattern below the first reflection pattern and the second reflection pattern;
a light blocking pattern disposed between the first optical conversion pattern and the second optical conversion pattern when viewed in a plan view,
wherein the insulating layer covers a top surface of the light blocking pattern that faces away from the first light emitting element.

17. The display panel of claim 16, wherein:
the first electrode of the first light emitting element and the first electrode of the second light emitting element are spaced apart from each other when viewed in a plan view; and
the second electrode of the first light emitting element and the second electrode of the second light emitting element are provided as a single body.

18. The display panel of claim 16, wherein the light blocking pattern comprises a metal layer disposed on an outer side surface of the first optical conversion pattern and an outer side surface of the second optical conversion pattern.

19. The display panel of claim 16, wherein the first optical conversion pattern comprises:
a first pattern and a second pattern disposed at opposite sides of the first electrode in a first direction when viewed in a plan view; and
a third pattern and a fourth pattern disposed at opposite sides of the first electrode in a second direction perpendicular to the first direction when viewed in a plan view.

20. The display panel of claim 19, wherein the inclined surface comprises first, second, third, and fourth regions corresponding to the first, second, third, and fourth patterns, respectively.

21. The display panel of claim 16, further comprising:
a first color filter configured to transmit a first light converted from the source light by the first optical conversion pattern; and
a second color filter configured to transmit a second light converted from the source light by the second optical conversion pattern.

22. The display panel of claim 21, wherein each of a portion of the first color filter and a portion of the second color filter is disposed between the first optical conversion pattern and the second optical conversion pattern.

23. The display panel of claim 22, wherein:
the light blocking pattern comprises a metal layer disposed on an outer side surface of the first optical conversion pattern and an outer side surface of the second optical conversion pattern; and
the metal layer is disposed between the outer side surface of the first optical conversion pattern and the portion of the first color filter.

24. The display panel of claim 21, wherein a portion of the first color filter and a portion of the second color filter are disposed on the light blocking pattern.

25. A display panel, comprising:
a light emitting element configured to emit a source light and including a first electrode, a light emitting layer disposed on the first electrode, and a second electrode disposed on the light emitting layer;

a pixel definition layer including an opening exposing at least a portion of the first electrode;

a first optical conversion pattern and a second optical conversion pattern disposed at two opposite sides of the first electrode on the pixel definition layer when viewed in a plan view;

an upper insulating layer disposed on the second electrode; and a light blocking pattern disposed outside the first optical conversion pattern and the second optical conversion pattern when viewed in a plan view, wherein the first optical conversion pattern and the second optical conversion pattern are in direct contact with the pixel definition layer, and wherein the upper insulating layer is disposed between the first optical conversion pattern and the second optical conversion pattern when viewed in a plan view, and the upper insulating layer is in contact with the first optical conversion pattern and the second optical conversion pattern.

* * * * *